US009548703B2

(12) United States Patent
Matsubara et al.

(10) Patent No.: US 9,548,703 B2
(45) Date of Patent: Jan. 17, 2017

(54) DISTORTION COMPENSATION APPARATUS, TRANSMISSION APPARATUS, AND DISTORTION COMPENSATION METHOD

(71) Applicant: FUJITSU LIMITED, Kawasaki-shi, Kanagawa (JP)

(72) Inventors: Satoshi Matsubara, Kawasaki (JP); Hiroyoshi Ishikawa, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 191 days.

(21) Appl. No.: 14/484,074

(22) Filed: Sep. 11, 2014

(65) Prior Publication Data

US 2015/0077179 A1     Mar. 19, 2015

(30) Foreign Application Priority Data

Sep. 17, 2013   (JP) .................................. 2013-191765

(51) Int. Cl.

| | |
|---|---|
| *H03F 1/26* | (2006.01) |
| *H04K 1/02* | (2006.01) |
| *H03F 1/32* | (2006.01) |
| *H03F 3/24* | (2006.01) |

(52) U.S. Cl.
CPC .......... *H03F 1/3247* (2013.01); *H03F 1/3258* (2013.01); *H03F 3/24* (2013.01); *H03F 2201/3227* (2013.01); *H03F 2201/3233* (2013.01)

(58) Field of Classification Search
None
See application file for complete search history.

(56) References Cited

U.S. PATENT DOCUMENTS

| | | |
|---|---|---|
| 2005/0062531 A1 | 3/2005 | Schreyer et al. |
| 2008/0094139 A1 | 4/2008 | Takano et al. |
| 2013/0015917 A1 | 1/2013 | Ishikawa et al. |

FOREIGN PATENT DOCUMENTS

| | | |
|---|---|---|
| JP | 2007-506366 A | 3/2007 |
| JP | 2010-050908 A | 3/2010 |
| JP | 2013-026631 A | 2/2013 |
| WO | WO 2007/004252 A1 | 1/2007 |

*Primary Examiner* — Patricia T Nguyen
(74) *Attorney, Agent, or Firm* — Arent Fox LLP

(57) ABSTRACT

A distortion compensation apparatus including: a memory configured to store a plurality of distortion compensation coefficients for compensating distortion to an input signal amplified by an amplifier, each of the plurality of distortion compensation coefficients being associated with a different combination of two addresses, and a processor configured to receive temperature information associated with a temperature of the amplifier, generate a first address based on the input signal at a first time, generate a second address based on an average of the input signal during a previous period preceding the first time, the average being calculated based on the temperature information, select a distortion compensation coefficient from the plurality of distortion compensation coefficients based on the first address and the second address, and compensate distortion to the input signal based on the selected distortion compensation coefficient.

10 Claims, 23 Drawing Sheets

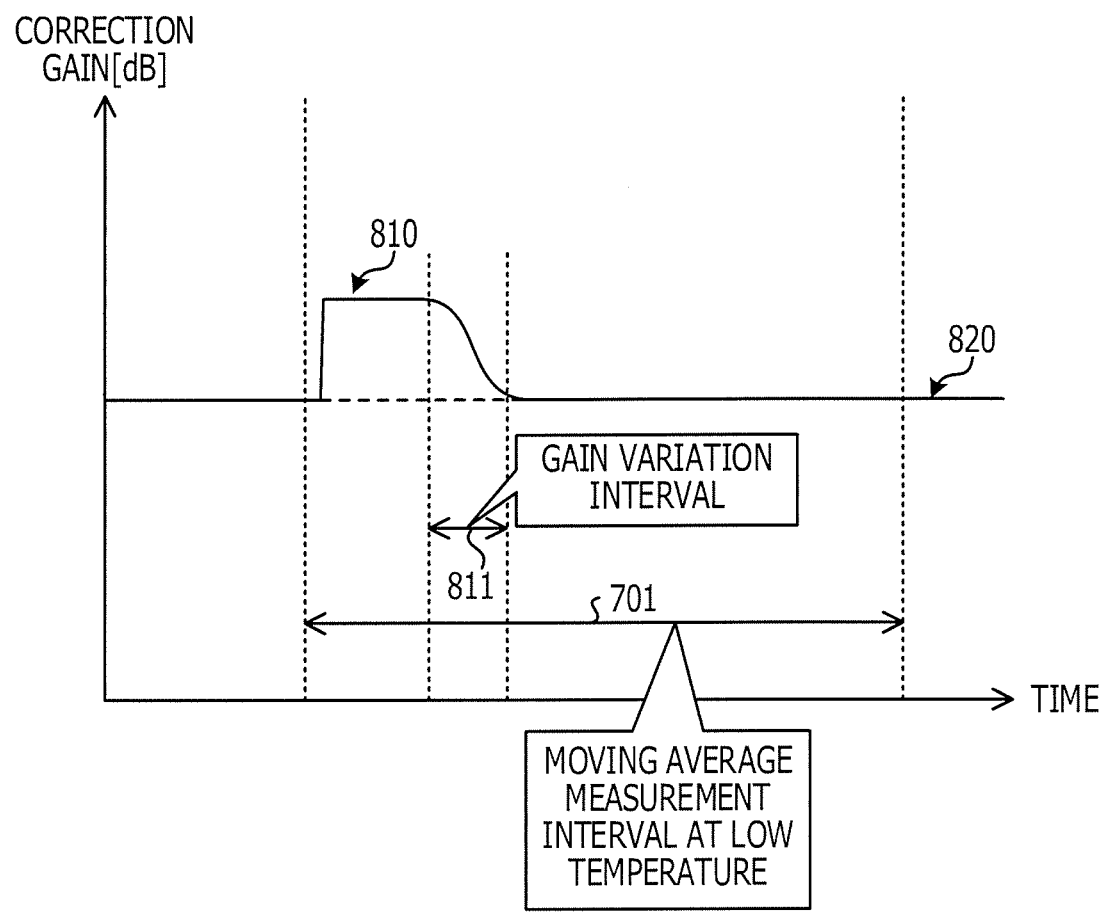

DISTORTION COMPENSATION APPARATUS, TRANSMISSION APPARATUS, AND DISTORTION COMPENSATION METHOD

CROSS-REFERENCE TO RELATED APPLICATION

This application is based upon and claims the benefit of priority from the prior Japanese Patent Application No. 2013-191765 filed on Sep. 17, 2013, the entire contents of which are incorporated herein by reference.

FIELD

The embodiments discussed herein are related to a distortion compensation apparatus, a transmission apparatus, and a distortion compensation method.

BACKGROUND

In recent years, in wireless communications such as wideband code division multiple access (W-CDMA), improvement of transmission efficiency by digitization has been promoted. When multi-value phase modulation system is applied to wireless communications, a technology is used that linearizes the amplification characteristics of a power amplifier for transmission on the transmitting side and reduces nonlinear distortion, thereby reducing an adjacent channel leakage power.

For example, a known technology stores a plurality of distortion compensation coefficients used for distortion compensation in a look up table (LUT), and reads a distortion compensation coefficient from the LUT by designating an address according to the power value of a transmission signal. In addition, another known technology maintains distortion compensation performance in order to reduce memory effect in which the output of an amplifier at a certain time is affected by the past inputs due to an electrical transient response called an Idsq (drain current) drift in the amplifier.

For example, a known technology generates a second LUT address in addition to a first LUT address according to the power value of the current signal, and reads a distortion compensation coefficient from the LUT using the first LUT address and the second LUT address, the second LUT address being generated in consideration of a variation in the power value of the past signals (see, for example, Japanese Laid-open Patent Publication No. 2013-026631).

SUMMARY

According to an aspect of the invention, a distortion compensation apparatus includes a memory configured to store a plurality of distortion compensation coefficients for compensating distortion to an input signal amplified by an amplifier, each of the plurality of distortion compensation coefficients being associated with a different combination of two addresses, and a processor configured to receive temperature information associated with a temperature of the amplifier, generate a first address based on the input signal at a first time, generate a second address based on an average of the input signal during a previous period preceding the first time, the average being calculated based on the temperature information, select a distortion compensation coefficient from the plurality of distortion compensation coefficients based on the first address and the second address, and compensate distortion to the input signal based on the selected distortion compensation coefficient.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 9 is an explanatory graph illustrating an example of a gain correction curve at a high temperature when the gain is corrected in a moving average measurement period at a low temperature;

DESCRIPTION OF EMBODIMENTS

Hereinafter, an embodiment of a distortion compensation apparatus, a transmitting apparatus, and a distortion compensation method will be described in detail with reference to the drawings.

With the conventional technology described above, distortion of signals may not be compensated with high accuracy depending on, for example, occurrence conditions of Idsq drift.

An aspect of the disclosed embodiments is to compensate distortion of signals with high accuracy.

EMBODIMENT

Example of Transmitting Apparatus

Figure 1A:
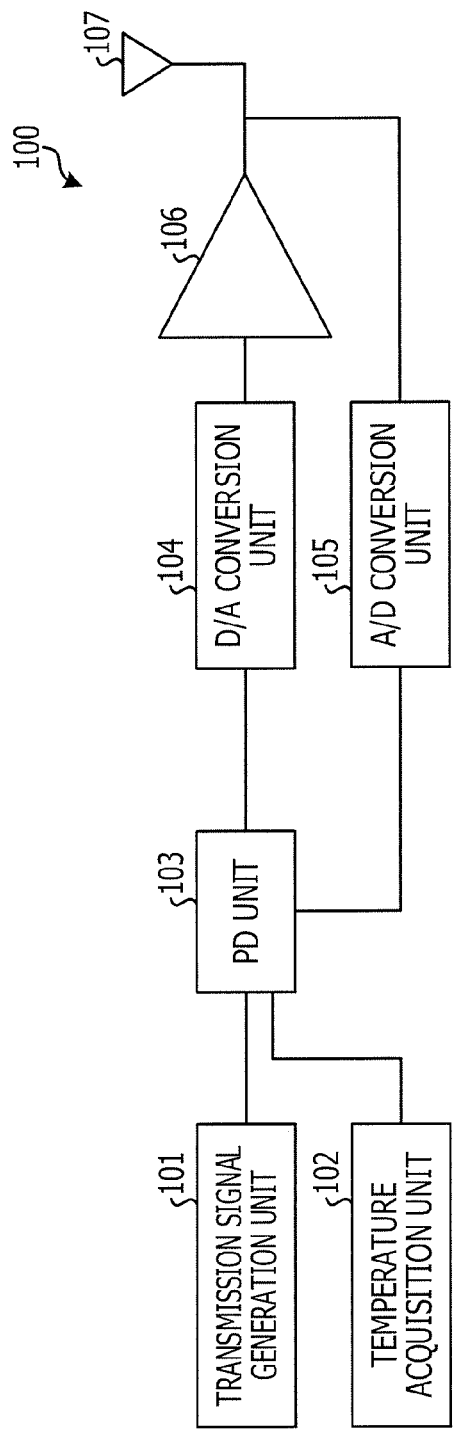
FIG. 1A is a block diagram illustrating an example of a transmitting apparatus.
Figure 1B:
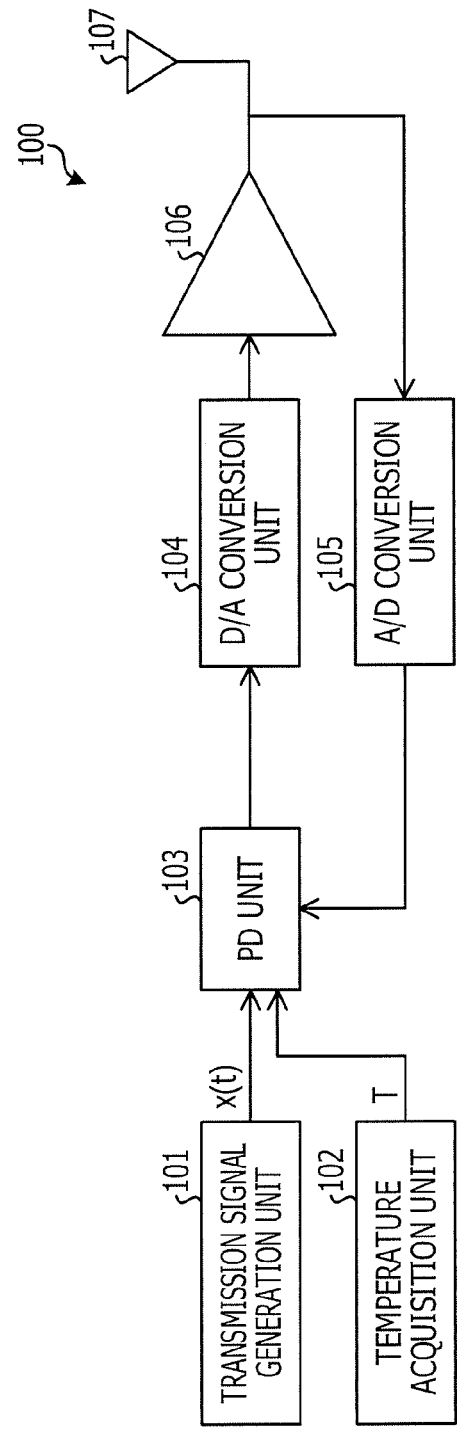
FIG. 1B is a diagram illustrating an example of a signal flow in the transmitting apparatus illustrated in FIG. 1A.

FIG. 1A is a block diagram illustrating an example of a transmitting apparatus. FIG. 1B is a diagram illustrating an example of a signal flow in the transmitting apparatus illustrated in FIG. 1A. The transmitting apparatus 100 illustrated in FIGS. 1A and 1B includes a transmission signal generation unit 101, a temperature acquisition unit 102, a pre-distortion (PD) unit 103, a digital to analog (D/A) conversion unit 104, an analog to digital (A/D) conversion unit 105, an amplifier 106, and an antenna 107.

The transmission signal generation unit 101 generates a transmission signal and outputs the generated transmission signal to the PD unit 103. Specifically, the transmission signal generation unit 101 has a serial to parallel (S/P) converter which converts a serial digital data sequence bit by bit alternately and outputs the converted bit to the PD unit 103. In this manner, the serial digital data sequence is converted to two sequences: a sequence of in-phase component signals (I signals) and a sequence of quadrature component signals (Q signals).

The temperature acquisition unit 102 acquires temperature information indicating a temperature of the transmitting apparatus 100 from a predetermined temperature sensor that detects the temperature of the transmitting apparatus 100, the temperature being one of predetermined values used for monitoring a variation in the gain of the amplifier 106. The temperature of the transmitting apparatus 100 may be represented by, for example, the temperature of the amplifier 106 which is included in the transmitting apparatus 100. For example, the temperature acquisition unit 102 acquires temperature information indicating the temperature of the amplifier 106 from a predetermined temperature sensor that detects the temperature of the amplifier 106. The temperature acquisition unit 102 outputs a signal to the PD unit 103, the signal indicating the temperature information. It is to be noted that a measurement point of the temperature sensor is located, for example, inside the case of the amplifier 106, but may be located outside the case of the amplifier 106.

The PD unit 103 receives a transmission signal which is outputted from the transmission signal generation unit 101 and is divided into I signal and Q signal. In addition, the PD unit 103 receives a feedback demodulated signal (feedback signal) which is outputted from the A/D conversion unit 105. The PD unit 103 calculates a distortion compensation coefficient based on the difference between a transmission signal outputted from the transmission signal generation unit 101 and a feedback signal outputted from the A/D conversion unit 105. The PD unit 103 stores the calculated distortion compensation coefficient at an address corresponding to the discrete power level of a transmission signal, and updates a look up table (LUT) 204a (see FIGS. 2A and 2B).

In addition, the PD unit 103 receives a signal outputted from the temperature acquisition unit 102, the signal indicating a temperature. Although the details will be described later, the PD unit 103 generates two corresponding addresses in the LUT 204a based on the signal indicating a temperature received from the temperature acquisition unit 102 and the power of the transmission signal received from the transmission signal generation unit 101. The PD unit 103 acquires a distortion compensation coefficient corresponding to the two generated addresses from the LUT 204a. The acquired distortion compensation coefficient is a distortion compensation coefficient that is based on the power level of the transmission signal and the temperature information. The PD unit 103 performs distortion compensation processing on a transmission signal to be inputted to the amplifier 106, using the acquired distortion compensation coefficient. The PD unit 103 outputs the transmission signal, which has undergone the distortion compensation processing, to the D/A conversion unit 104. The details of address generation and distortion compensation performed by the PD unit 103 will be described later. The PD unit 103 achieves a distortion compensation apparatus.

The D/A conversion unit 104 receives the transmission signal which has undergone the distortion compensation processing and is outputted from the PD unit 103. The D/A conversion unit 104 converts the transmission signal outputted from the PD unit 103 into an analog signal. The D/A conversion unit 104 outputs the transmission signal, which has been converted into an analog signal, to the amplifier 106. The amplifier 106 receives the transmission signal outputted from the D/A conversion unit 104. The amplifier 106 is an amplification unit that amplifies the power of the received transmission signal. The amplifier 106 then outputs the amplified transmission signal to the antenna 107 and the A/D conversion unit 105.

The transmission signal outputted from the amplifier 106 branches off in two directions by a coupler or the like and respective parts of the signal are outputted to the antenna 107 and the A/D conversion unit 105. The antenna 107 radiates the transmission signal outputted from the amplifier 106 into space. The transmission signal outputted to the A/D conversion unit 105 is a feedback signal for the PD unit 103 to perform distortion compensation processing.

The A/D conversion unit 105 converts a feedback signal, which has been outputted from the amplifier 106, into a digital signal. The A/D conversion unit 105 outputs the transmission signal, which has been converted into a digital signal, to the PD unit 103. In the transmitting apparatus 100, an amplifying device is achieved by, for example, the transmission signal generation unit 101, the temperature acquisition unit 102, the PD unit 103, the D/A conversion unit 104, the A/D conversion unit 105, and the amplifier 106 where the antenna 107 is excluded.

(Example of PD Unit)

Figure 2A:
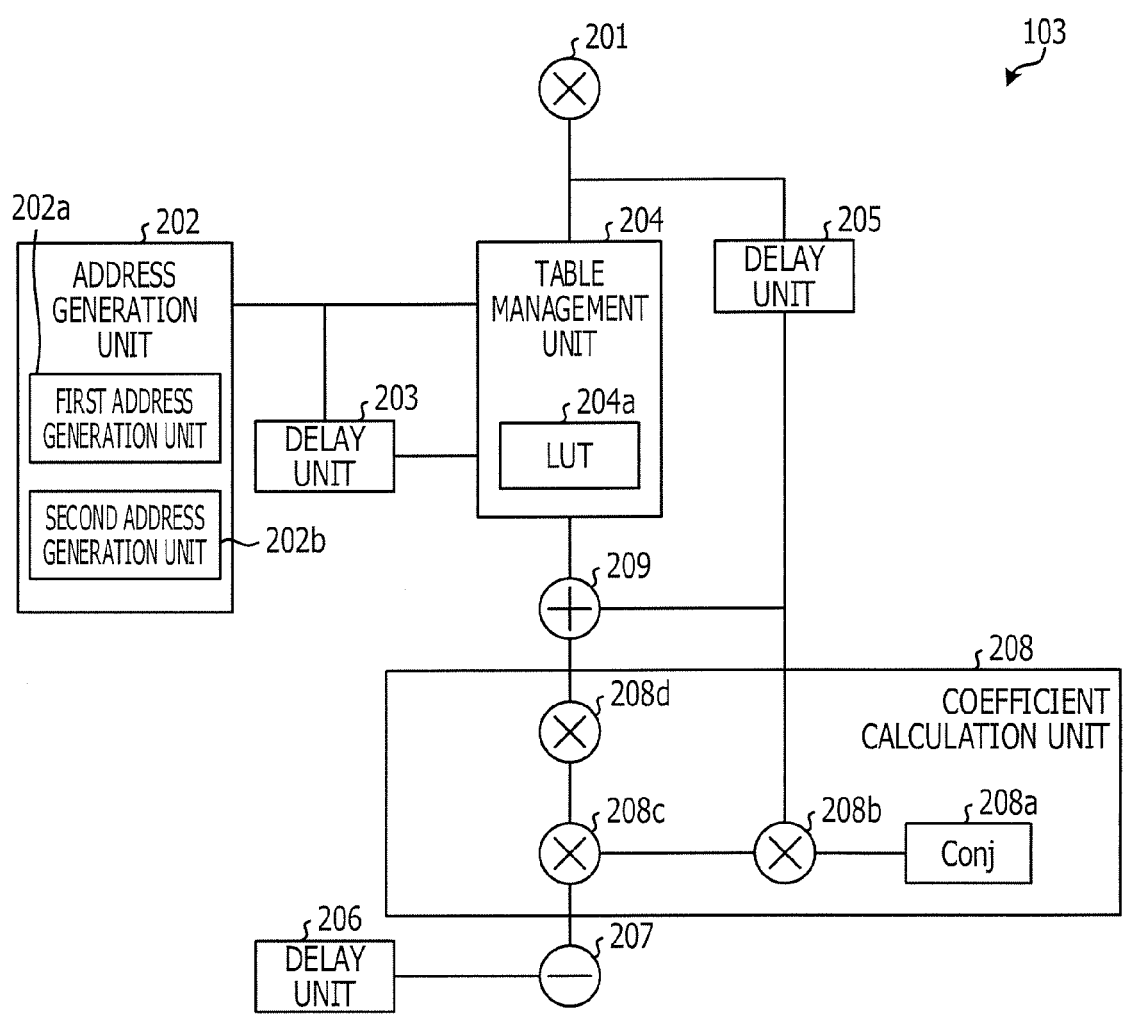
FIG. 2A is a block diagram illustrating an example of a PD unit.
Figure 2B:
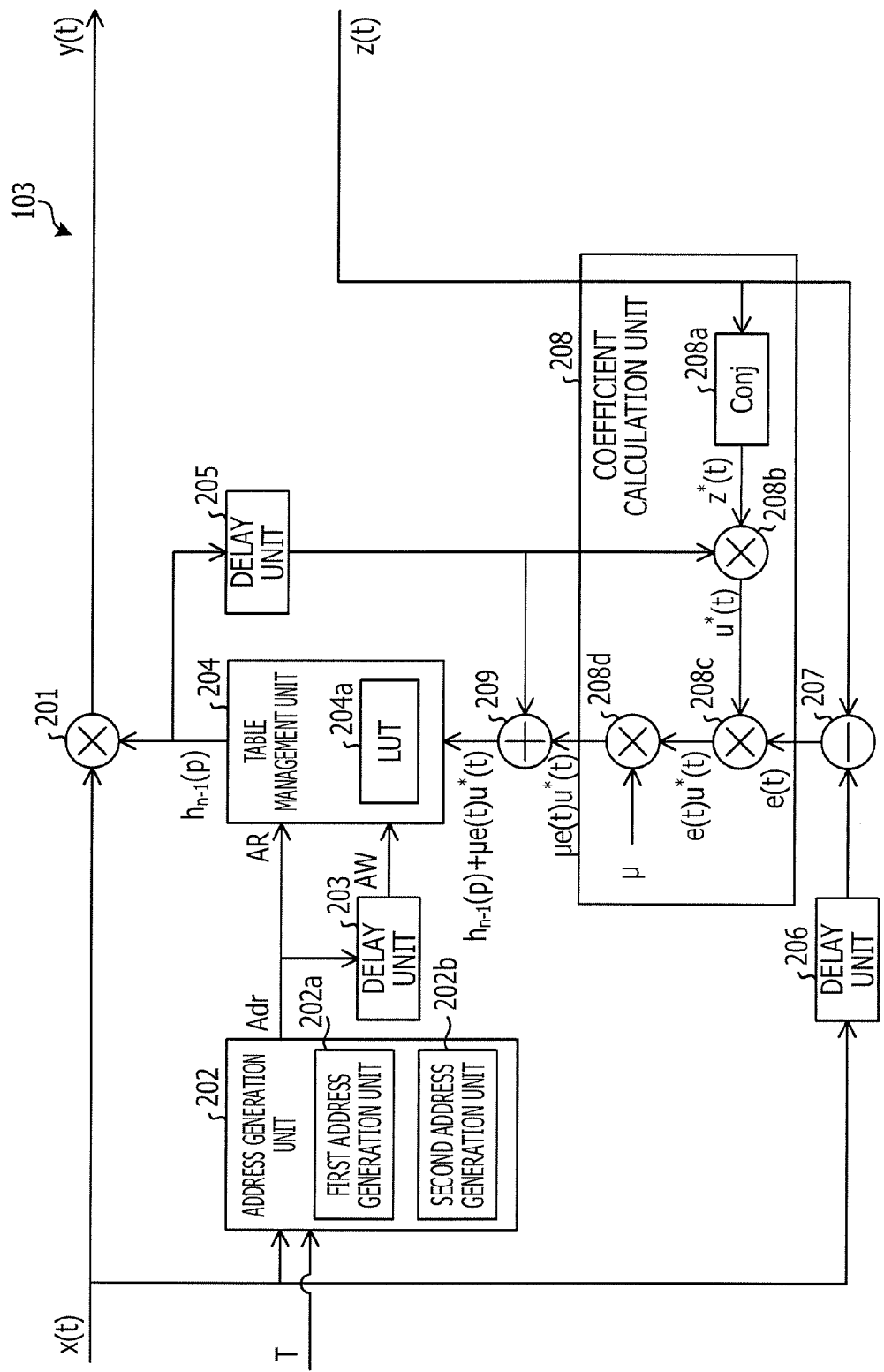
FIG. 2B is a diagram illustrating an example of a signal flow in the PD unit illustrated in FIG. 2A.

FIG. 2A is a block diagram illustrating an example of a PD unit. FIG. 2B is a diagram illustrating an example of a signal flow in the PD unit illustrated in FIG. 2A. The PD unit 103 compensates signal distortion due to the amplifier 106, for example, by using an adaptive least mean square (LMS). As illustrated in FIGS. 2A and 2B, the PD unit 103 includes a multiplication unit 201, an address generation unit 202, a delay unit 203, a table management unit 204, a delay unit 205, a delay unit 206, a subtraction unit 207, a coefficient calculation unit 208, and an addition unit 209. In the following description, x, y, z, h, u, and e are complex numbers. It is to be noted that * indicates a conjugate complex number and t indicates time.

A signal x(t), which is inputted to the PD unit 103, is inputted to each one of the multiplication unit 201, the address generation unit 202, and the delay unit 206. The multiplication unit 201 is a distortion compensation unit that performs distortion compensation on a transmission signal (input signal) using a distortion compensation coefficient. The multiplication unit 201 acquires a distortion compensation coefficient corresponding to a combination of the below-described first address and second address from the LUT 204a, and performs pre-distortion processing on an input signal to the A/D conversion unit 105 using the acquired distortion compensation coefficient.

Specifically, the multiplication unit 201 multiplies the input signal x(t) by a distortion compensation coefficient $h_{n-1}(p)$ which is outputted from the table management unit 204. The multiplication unit 201 outputs a signal y(t), which is the multiplication result, to the D/A conversion unit 104. The signal outputted to the D/A conversion unit 104 is further outputted to the amplifier 106 to be amplified. Part of the signal amplified by the amplifier 106 is outputted to the subtraction unit 207 and the coefficient calculation unit 208 as a feedback signal z(t).

The address generation unit 202 has a first address generation unit 202a and a second address generation unit 202b. The first address generation unit 202a generates a first address based on the power value of an input signal, the first address for acquiring a distortion compensation coefficient from the table management unit 204. Specifically, the first address generation unit 202a generates an address in the X-axis direction as the first address based on the power value of the current transmission signal (for example, at a first time). The second address generation unit 202b generates an address in the Y-axis direction as the second address based on the power value of the past transmission signals and the temperature information of the amplifier 106.

The second address generation unit 202b generates a second address based on a moving average value which is an average value (moving average value) of the past input signals and is calculated by using a parameter according to the temperature information acquired by the temperature acquisition unit 102. The parameter is, for example, a time period (moving average measurement period), and may be a weighting coefficient or a smoothing coefficient (time constant) as illustrated in the below-described modifications.

Specifically, the second address generation unit 202b generates a second address based on a moving average value which is calculated over a moving average measurement period (for example, a previous period preceding the first time) having a length according to the temperature information. For example, in the case where the temperature information indicates a first temperature, the second address generation unit 202b generates a second address based on a moving average value which is calculated over a moving average measurement period having a shorter length compared with the case where the temperature information indicates a second temperature which is lower than the first temperature.

The first temperature is a temperature higher than or equal to 50° C., for example. The second temperature is a temperature lower than 50° C., for example. Note that this embodiment and the following embodiments are able to be easily extended to those in case where a temperature is classified in more than three ranges, although in these embodiments, a temperature is classified in two ranges. The second address generation unit 202b is not limited to have a configuration which uses a moving average measurement period according to the first temperature or the second temperature, and may use a moving average measurement period which is shorter as the temperature information indicates a higher temperature. The second address generation unit 202b generates a second address based on a simple moving average value which is calculated over a moving average measurement period.

The address generation unit 202 generates a combined address Adr in which an address in the X-axis direction and an address in the Y-axis direction are combined. The combined address Adr is an address which uniquely corresponds to a combination of the address in the X-axis direction and the address in the Y-axis direction, for example. The address generation unit 202 generates a combined address Adr which is obtained by arranging the address in the X-axis direction and the address in the Y-axis direction in series like "the address in the X-axis direction: the address in the Y-axis direction" as one example. The combined address Adr generated by the address generation unit 202 is outputted to the delay unit 203 as well as outputted to the table management unit 204 as a read address AR. It is to be noted that the information serves as the basis for generating an address is not limited to the power value of the current signal, but also the amplitude value or phase value thereof.

The delay unit 203 delays the combined address Adr outputted from the address generation unit 202, and outputs the delayed combined address Adr as a write address AW to the table management unit 204. A delay amount in the delay unit 203 is defined based on a calculation time which is taken for the subtraction unit 207 and the coefficient calculation unit 208 to obtain an updated value for the LUT 204a. In this manner, a combined address Adr outputted from the address generation unit 202 may be used as a write address AW.

The table management unit 204 manages the LUT 204a that stores distortion compensation coefficients each of which is calculated by the subtraction unit 207 and the coefficient calculation unit 208. Specifically, the table management unit 204 stores the LUT 204a by which a distortion compensation coefficient and a combination of two different addresses are associated with each other. The distortion compensation coefficient is a coefficient that is used for distortion compensation in the multiplication unit 201 and for compensating the distortion of the amplifier 106 that amplifies an input signal. The combination of two different addresses is a combination of an address in the X-axis direction and an address in the Y-axis direction. The LUT 204a achieves a distortion compensation coefficient storage unit.

The table management unit 204 acquires an address in the X-axis direction and an address in the Y-axis direction from a read address AR outputted from the address generation unit 202. The table management unit 204 then reads a distortion compensation coefficient from the LUT 204a, the distortion compensation coefficient corresponding to the address in the X-axis direction and the address in the Y-axis direction acquired. The table management unit 204 outputs the read distortion compensation coefficient $h_{n-1}(p)$ to each of the multiplication unit 201 and the delay unit 205.

The table management unit 204 also acquires an address in the X-axis direction and an address in the Y-axis direction based on a write address AW outputted from the delay unit 203. The table management unit 204 then writes an updated value in an area of the LUT 204a, the updated value for distortion compensation coefficient outputted from the addition unit 209, the area corresponding to the address in the X-axis direction and the address in the Y-axis direction acquired.

The delay unit 205 delays the distortion compensation coefficient $h_{n-1}(p)$ outputted from the table management unit 204, and outputs $h_{n-1}(p)$ to each of the coefficient calculation unit 208 and the addition unit 209. The delay unit 206 delays the input signal x(t) and outputs the delayed input signal to the subtraction unit 207.

The subtraction unit 207 and the coefficient calculation unit 208 calculate a distortion compensation coefficient based on an input signal which has not undergone the distortion compensation by the multiplication unit 201 and an output signal (feedback signal) of the amplifier 106. Specifically, the subtraction unit 207 outputs a difference e(t) between the feedback signal z(t) and the transmission signal x(t) to the coefficient calculation unit 208, the transmission signal being outputted from the delay unit 206. The coefficient calculation unit 208 calculates an updated value of a distortion compensation coefficient which has been stored in the LUT 204a of the table management unit 204.

The coefficient calculation unit 208 has a conjugate complex signal output unit 208a (Conj) and multiplication units 208b, 208c, and 208d. The conjugate complex signal output unit 208a outputs a conjugate complex signal z*(t) of the feedback signal z(t) to the multiplication unit 208b. The multiplication unit 208b outputs a multiplication result u*(t) ($=h_{n-1}(p)z^*(t)$) to the multiplication unit 208c, the multiplication result being the product of the distortion compensation coefficient $h_{n-1}(p)$ from the delay unit 205 and the conjugate complex signal z*(t) from the conjugate complex signal output unit 208a.

The multiplication unit 208c outputs a multiplication result e(t)u*(t) to the multiplication unit 208d, the multiplication result being the product of the difference e(t) from the subtraction unit 207 and the multiplication result u*(t) from the multiplication unit 208b. The multiplication unit 208d outputs a multiplication result μe(t)u*(t) to the addition unit 209, the multiplication result being the product of the multiplication result e(t)u*(t) from the multiplication unit 208c and a step size parameter μ.

The addition unit 209 adds up the distortion compensation coefficient $h_{n-1}(p)$ from the delay unit 205 and the multiplication result μe(t)u*(t) from the multiplication unit 208d. The addition unit 209 outputs the addition result $h_{n-1}(p)+\mu e(t)u^*(t)$ to the table management unit 204 as an updated value for the LUT 204a. The updated value outputted from the addition unit 209 is written in an area of the LUT 204a, the area corresponding to a write address AW inputted to the table management unit 204.

A delay time of the delay units 203, 205, 206 is, for example, time D since the signal x(t) is inputted to the PD unit 103 until the feedback signal z(t) is inputted to the subtraction unit 207. Specifically, let D0 be the delay time of signal in the amplifier 106 and let D1 be the delay time of signal in the A/D conversion unit 105, then the delay time of each of the delay units 203, 205, 206 is set to be D0+D1.

Thus, for the write address AW inputted to the table management unit 204, the LUT 204a of the table management unit 204 is updated to distortion compensation coefficient h(p), for which the difference signal e(t) between the signal x(t) and the feedback signal z(t) is minimum. Finally, h(p) converges to an optimal distortion compensation coefficient value, and the signal distortion due to the amplifier 106 is compensated.

In this manner, the PD unit 103 acquires a distortion compensation coefficient from the LUT 204a of the table management unit 204 based on an address in the X-axis direction and an address in the Y-axis direction, and performs distortion compensation.

Although the configuration has been described in which the address generation unit 202 generates and outputs a combined address Adr in which an address in the X-axis direction and an address in the Y-axis direction are combined, without being limited to such a configuration, it is sufficient that the table management unit 204 is able to acquire an address in the X-axis direction and an address in the Y-axis direction. For example, a configuration may be adopted in which the address generation unit 202 outputs each of an address in the X-axis direction and an address in the Y-axis direction.

(Example of Time Variation of Idsq Drift)

Figure 3:
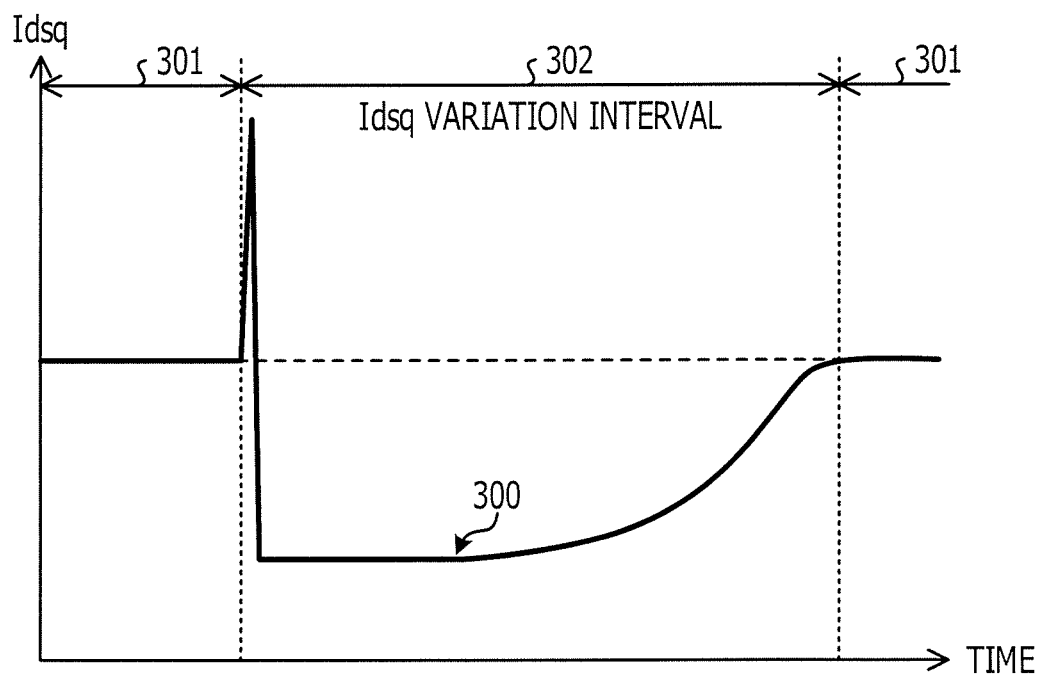
FIG. 3 is an explanatory graph illustrating an example of a time variation of Idsq drift.

Here, an example of a time variation of Idsq (drain current) drift will be described. FIG. 3 is an explanatory graph illustrating an example of a time variation of Idsq drift. In a device which uses a GaN (gallium nitride) high electron mobility transistor, when a high power signal is inputted, a transient response called Idsq drift occurs.

In FIG. 3, the horizontal axis indicates time and the vertical axis indicates Idsq. As illustrated in graph 300, Idsq indicates a fixed value and stable in an period 301. On the other hand, an period 302 is an Idsq variation period. As illustrated in the graph 300, it is difficult for current to flow through due to input of a high power signal in the period 302, but Idsq recovers with time.

(Example of Time Variation in Gain when Idsq Drift has Occurred)

Figure 4:
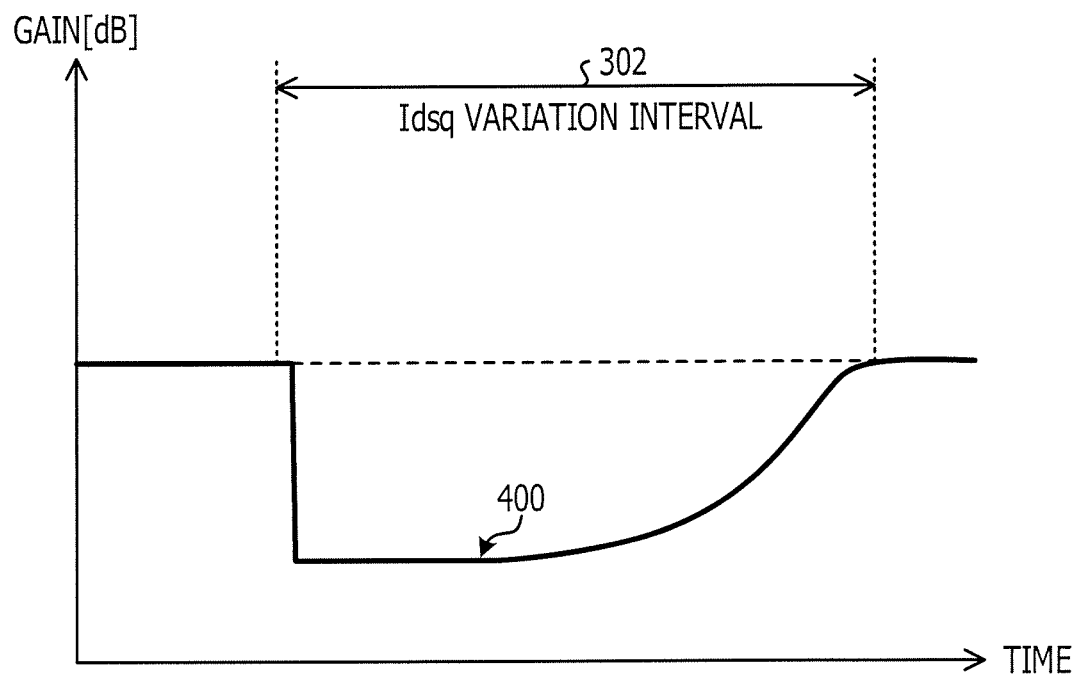
FIG. 4 is an explanatory graph illustrating an example of a time variation of gain when Idsq drift has occurred.

FIG. 4 is an explanatory graph illustrating an example of a time variation of gain when Idsq drift has occurred. In FIG. 4, the horizontal axis indicates time and the vertical axis indicates the gain [dB] of the amplifier 106. The period 302 is an Idsq variation period. As illustrated in graph 400, when Idsq drift has occurred, it is difficult for current to flow through and thus the gain of the amplifier 106 decreases and recovers with time.

(Example of Ideal Correction Curve for Gain When Idsq Drift Has Occurred)

Figure 5:
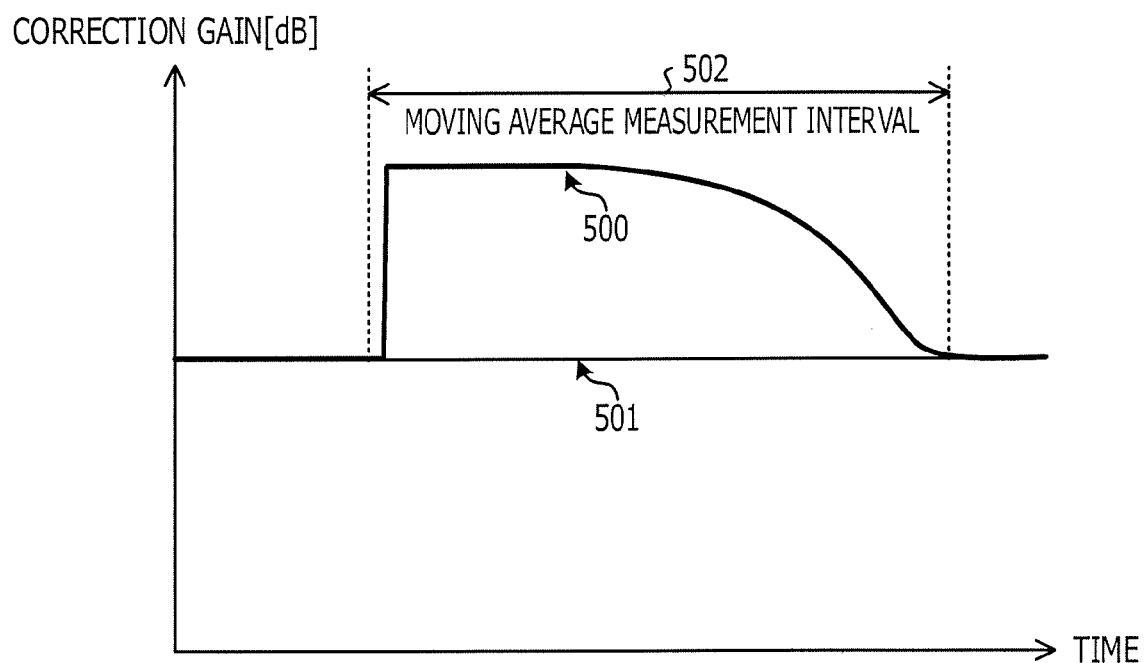
FIG. 5 is an explanatory graph illustrating an example of an ideal correction curve for the gain when Idsq drift has occurred.

FIG. 5 is an explanatory graph illustrating an example of an ideal correction curve for the gain when Idsq drift has occurred. In FIG. 5, the horizontal axis indicates time and the vertical axis indicates the correction gain [dB] for the amplifier 106. An period 502 is equivalent to the Idsq variation period (the period 302 of FIG. 4) and is a moving average measurement period in which correction of gain is made.

A graph 500 illustrates a correction gain for correcting the gain which has decreased (see the graph 400 of FIG. 4) due to an occurrence of Idsq drift. Flipping the graph 500 symmetrically over a line 501 gives a similar shape to the graph 400 of FIG. 4, for example. In this manner, the gain is corrected by making the graph 500 symmetric to the graph 400 with respect to the line 501.

(Example of Time Variation of Idsq Drift Due to Temperature)

Figure 6:
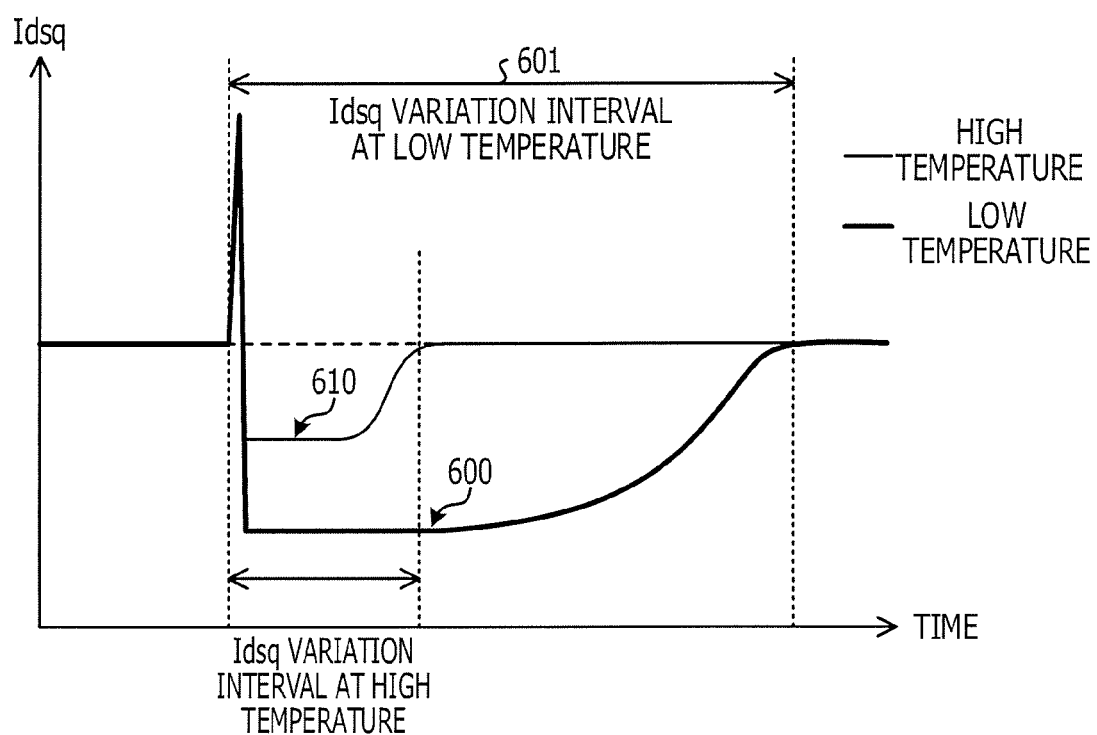
FIG. 6 is an explanatory graph illustrating an example of a time variation of Idsq drift due to a temperature.

FIG. 6 is an explanatory graph illustrating an example of a time variation of Idsq drift due to a temperature. In FIG. 6, the horizontal axis indicates time and the vertical axis indicates Idsq. A graph 600 illustrates a time variation of Idsq drift at a low temperature. In the present embodiment, high temperature is defined as the temperature that is higher than or equal to 50° C. and low temperature is defined as the temperature that is lower than 50° C. As illustrated in the graph 600, it is difficult for current to flow through at a low temperature in an Idsq variation period at low temperature 601, but Idsq recovers with time.

A graph 610 illustrates a time variation of Idsq drift at a high temperature. As illustrated in the graph 610, it is difficult for current to flow through at a high temperature in an Idsq variation period at high temperature 611, but Idsq recovers with time. The Idsq variation period at low temperature 601 and the Idsq variation period at high temperature 611 differ from each other in Idsq and time taken for recovery. Specifically, in the case of a high temperature, Idsq drift is smaller and the time taken for recovery is shorter compared with the case of a low temperature.

(Example of Gain Correction Curve at Low Temperature when Gain is Corrected in Moving Average Measurement Period at High Temperature)

Figure 7:
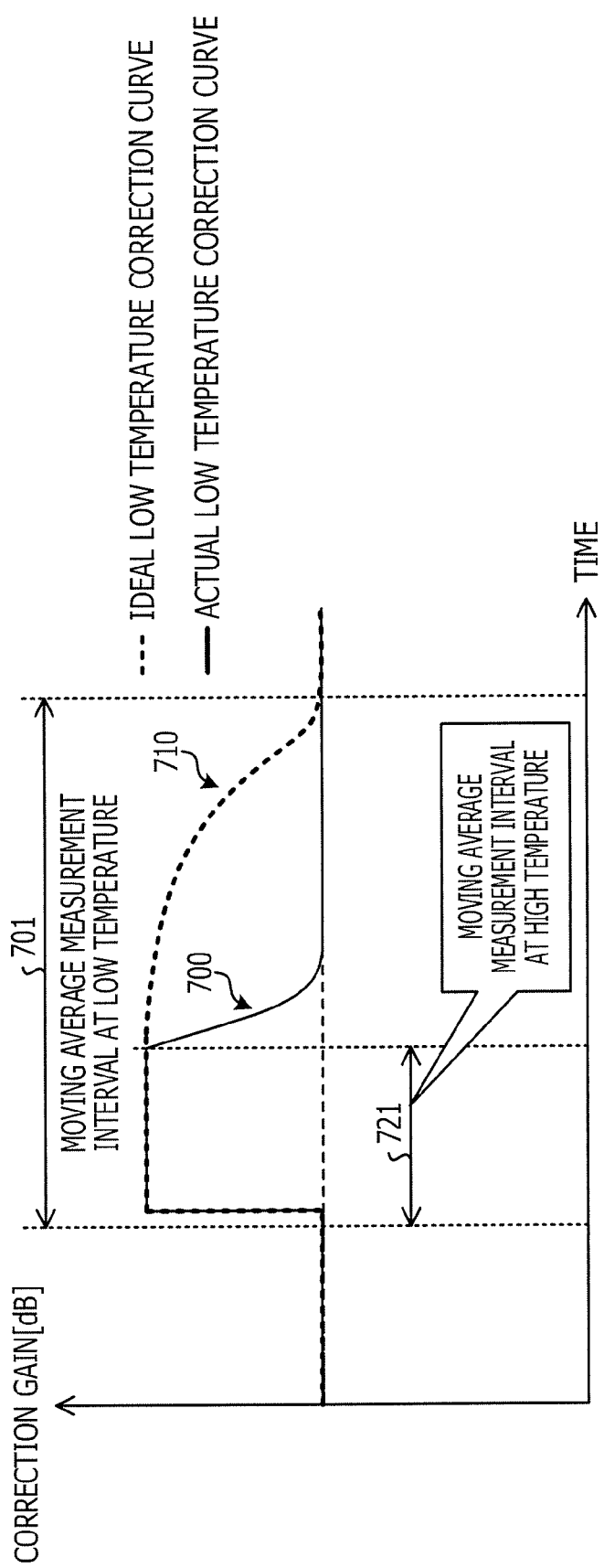
FIG. 7 is an explanatory graph illustrating an example of a gain correction curve at a low temperature when the gain is corrected in a moving average measurement period at a high temperature.

FIG. 7 is an explanatory graph illustrating an example of a gain correction curve when the gain is corrected at a low temperature in a moving average measurement period at a high temperature. In FIG. 7, the horizontal axis indicates time and the vertical axis indicates the correction gain [dB] for the amplifier 106. A moving average measurement period at low temperature 701 is an period equivalent to the Idsq variation period at low temperature 601 of FIG. 6. A moving average measurement period at high temperature 721 is an period equivalent to the Idsq variation period at high temperature 611 of FIG. 6.

A graph 710 illustrates an ideal correction gain for correcting the gain at a low temperature, the gain being decreased (see the graph 600 of FIG. 6) due to an occurrence of Idsq drift. Flipping the graph 710 symmetrically over a line 730 gives a similar shape to the graph 600 of FIG. 6.

On the other hand, a graph 700 illustrates a correction gain for correcting the gain at a low temperature in the moving average measurement period at high temperature 721, the gain being decreased (see the graph 610 of FIG. 6) due to an occurrence of Idsq drift. In this case, as illustrated in the graph 700, the correction gain after the moving average measurement period at high temperature 721 is smaller compared with the graph 710. In this manner, in the case where the gain is corrected in the moving average measurement period at high temperature 721, the gain is not sufficiently corrected after the moving average measurement period at high temperature 721, and thus distortion compensation performance reduces.

Here, in the case where the gain is corrected at a high temperature in the moving average measurement period at low temperature 701, the moving average measurement period is too long for the actual decrease in gain, and thus distortion compensation performance reduces. The details will be described with reference to FIGS. 8 and 9 in the following.

(Example of Gain Correction Curve when Gain is Corrected at High Temperature)

Figure 8:
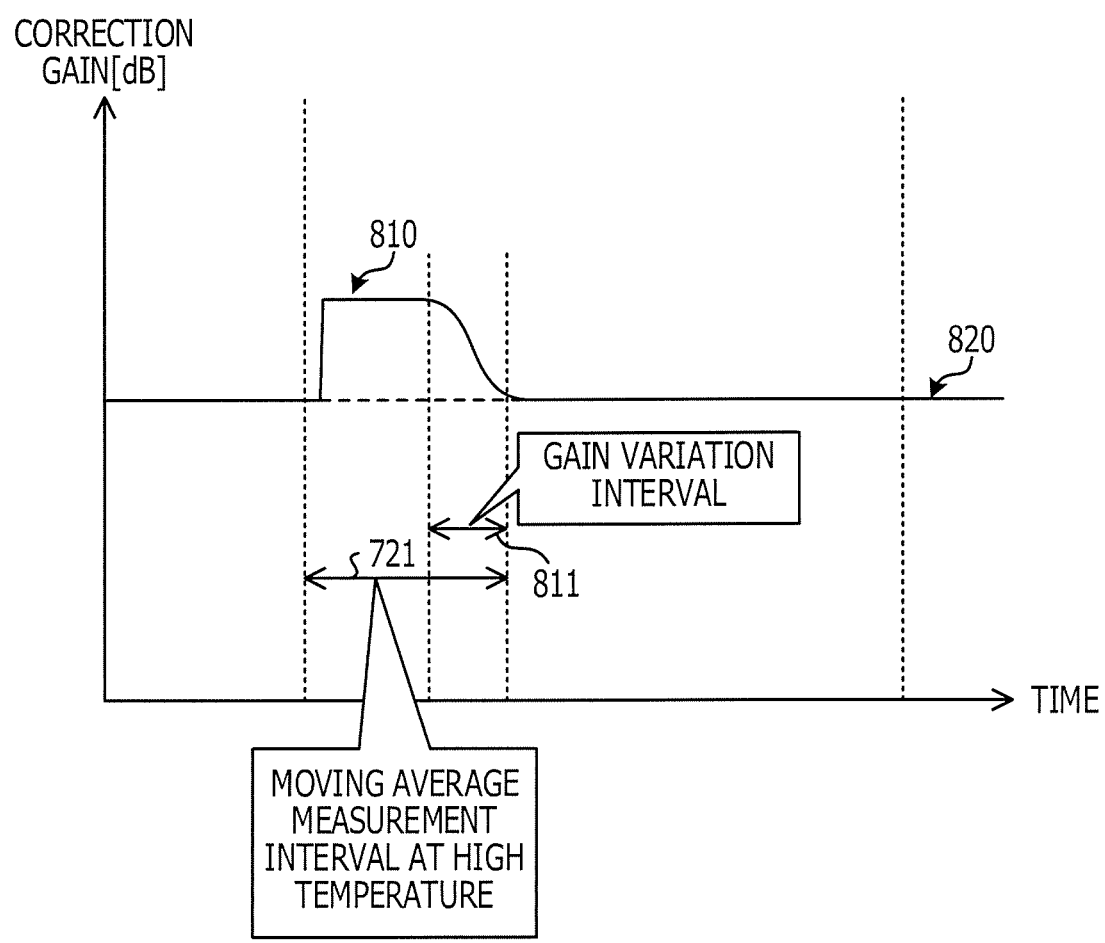
FIG. 8 is an explanatory graph illustrating an example of a gain correction curve at a high temperature when the gain is corrected in a moving average measurement period at a high temperature.

FIG. 8 is an explanatory graph illustrating an example of a gain correction curve at a high temperature when the gain is corrected in a moving average measurement period at a high temperature. FIG. 9 is an explanatory graph illustrating an example of a gain correction curve at a high temperature when the gain is corrected in a moving average measurement period at a low temperature. In FIGS. 8 and 9, the horizontal axis indicates time and the vertical axis indicates the correction gain [dB] for the amplifier 106.

In FIG. 8, a graph 810 illustrates an ideal correction gain for correcting the gain at a high temperature in the moving average measurement period at high temperature 721, the gain being decreased (see the graph 610 of FIG. 6) due to an occurrence of Idsq drift. Flipping the graph 810 symmetrically over a line 820 gives a similar shape to the graph 610 of FIG. 6.

A gain variation period 811 is an period in which the correction gain in the graph 810 decreases. At a high temperature, the gain variation period 811 has a length of 5 μsec, for example. The moving average measurement period at high temperature 721 has a length of 20 μsec, for example. Under the assumption that the number of the second addresses generated based on the moving average value of the power of input signals is 100, when the gain is corrected in the moving average measurement period at high temperature 721, the rate of the number of addresses assigned to the gain variation period 811 is 100×5/20=25%.

In FIG. 9, the graph 810 illustrates a correction gain for correcting the gain at a high temperature in the moving average measurement period at low temperature 701, the gain being decreased (see the graph 610 of FIG. 6) due to an occurrence of Idsq drift.

At a high temperature, the gain variation period 811 has a length of 5 μsec, for example. The moving average measurement period at low temperature 701 has a length of 100 μsec, for example. Under the assumption that the number of the second addresses generated based on the moving average value of the power of input signals is 100, when the gain is corrected in the moving average measurement period at low temperature 701, the rate of the number of addresses assigned to the gain variation period 811 is 100×5/100=5%.

Thus, a difference of 5 times in address resolution occurs between the case where the gain is corrected at a high temperature in the moving average measurement period at low temperature 701 and the case where the gain is corrected at a high temperature in the moving average measurement period at high temperature 721. That is, if the gain is corrected at a high temperature in the moving average measurement period at low temperature 701, fine control may not be performed in the gain variation period 811, and thus distortion compensation performance reduces.

For this reason, in the present embodiment, the gain is corrected in a moving average measurement period which corresponds to a time period in which Idsq drift occurs at a high temperature or at a low temperature. Specifically, in the present embodiment, when distortion compensation is performed using an address in the X-axis direction based on the current signal and an address in the Y-axis direction based on the moving average value of signals in the past, the moving average measurement period is adjusted according to the temperature of the amplifier 106.

(Example of Address Generation Unit)

Figure 10A:
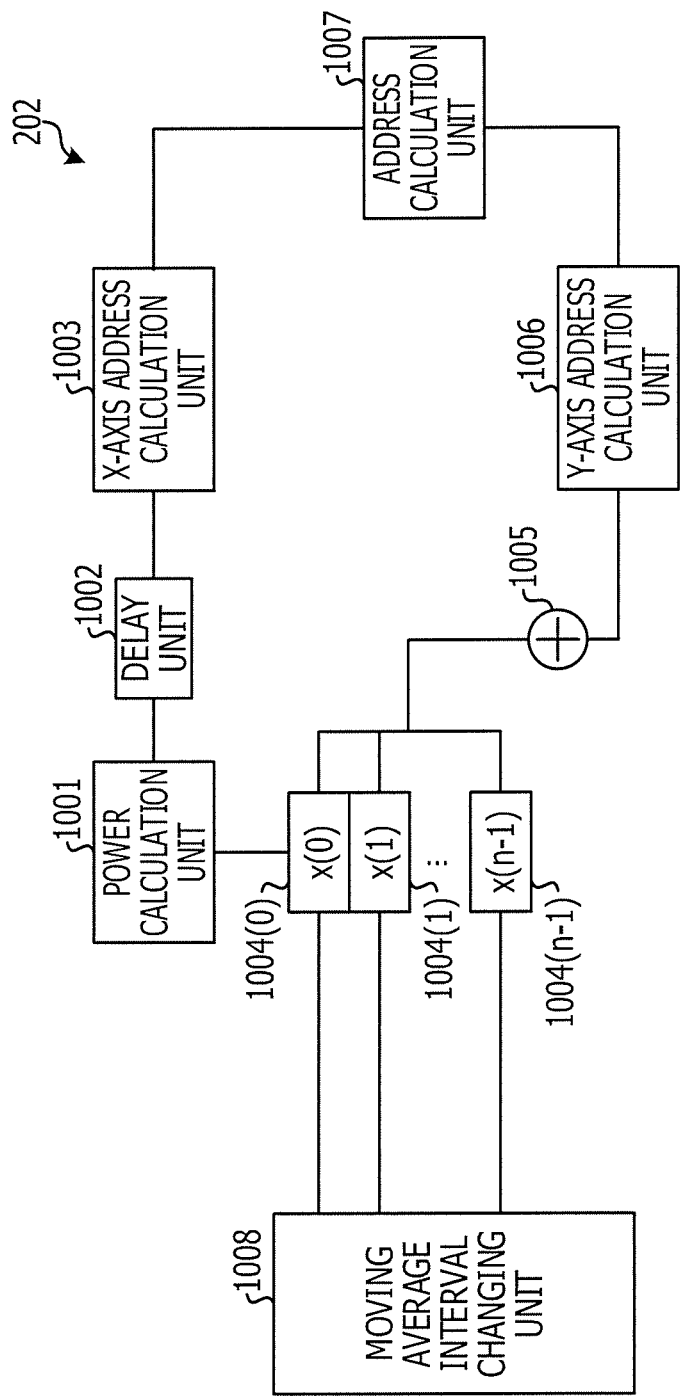
FIG. 10A is a block diagram illustrating an example of an address generation unit.
Figure 10B:
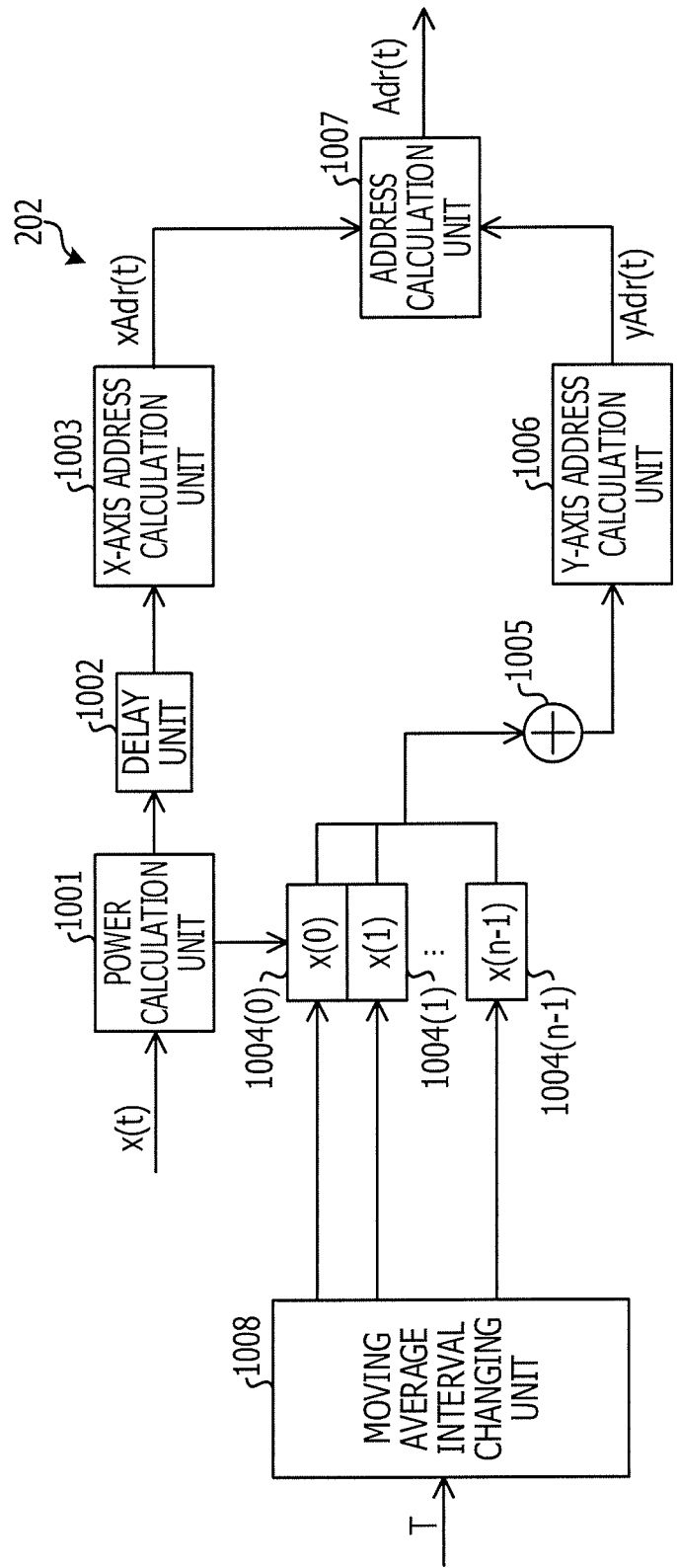
FIG. 10B is a diagram illustrating an example of a signal flow in the address generation unit illustrated in FIG. 10A.

FIG. 10A is a block diagram illustrating an example of an address generation unit. FIG. 10B is a diagram illustrating an example of a signal flow in the address generation unit illustrated in FIG. 10A. As illustrated in FIGS. 10A and 10B, the address generation unit 202 (see FIGS. 2A and 2B) includes a power calculation unit 1001, a delay unit 1002, a X-axis address calculation unit 1003, a memory 1004 having 1004(0), 1004(1), 1004(2), . . . , 1004(n−1), an addition unit 1005, a Y-axis address calculation unit 1006, an address calculation unit 1007, and a moving average period changing unit 1008.

A signal x(t) inputted to the address generation unit 202 is inputted to the power calculation unit 1001. The power calculation unit 1001, the delay unit 1002, and the X-axis address calculation unit 1003 generate a first address (address in the X-axis direction) for acquiring a distortion compensation coefficient from the table management unit 204 based on the power value (power) of the input signal. Specifically, the power calculation unit 1001 calculates power p ($=x^2(t)$) of the input signal x(t). The power calculation unit 1001 outputs power information indicating the calculated power p to each of the delay unit 1002, the X-axis address calculation unit 1003, and the memory 1004.

The delay unit 1002 delays the address in the X-axis direction outputted from the power calculation unit 1001 by a time taken for Y-axis address generation processing performed by the Y-axis address calculation unit 1006, then outputs the delayed address to the X-axis address calculation unit 1003. The X-axis address calculation unit 1003 calculates an address in the X-axis direction by normalizing the power information outputted from the delay unit 1002. The X-axis address calculation unit 1003 outputs the calculated address in the X-axis direction to the address calculation unit 1007 (xAdr(t)).

The memory 1004(0) stores a power calculation result x(0) which is outputted from the power calculation unit 1001. A power calculation result x(j), which is already stored in the memory 1004(j), is shifted and stored in the memory 1004(j+1). For example, the power calculation result x(0) already stored in the memory 1004(0) is stored in the memory 1004(1) as the power calculation result x(1).

A power calculation result x(n−1) already stored in the memory 1004(n−1) is discarded. That is, when a power calculation result x(0) is newly stored in the memory 1004(0), the old power calculation result x(n−1) in the memory 1004(n−1) is discarded. Consequently, there are stored the power calculation results x(0) to x(n−1) in a time period from the current to a predetermined period in the past.

The power calculation results x(0) to x(n−1) stored in the memory 1004(0) to 1004(n−1) are outputted to the addition unit 1005. The addition unit 1005 adds up the power calculation results x(0) to x(n−1) stored in the memory 1004(0) to 1004(n−1), and outputs the sum to the Y-axis address calculation unit 1006.

The Y-axis address calculation unit 1006 calculates a second address (address in the Y-axis direction) by normalizing the power calculation results x(0) to x(n−1) outputted from the addition unit 1005.

The address calculation unit 1007 combines the address in the X-axis direction (xAdr(t)) outputted from the X-axis address calculation unit 1003 and the address in the Y-axis direction (yAdr(t)) outputted from the Y-axis address calculation unit 1006, and outputs the combined address (Adr(t)). The combined address outputted from the address calculation unit 1007 is outputted to the delay unit 203 (see FIGS. 2A and 2B) as well as outputted to the table management unit 204 as a read address AR.

The moving average period changing unit 1008 receives an input signal T which is outputted from the temperature acquisition unit 102. The moving average period changing unit 1008 changes a time period in which the power calculation results x(0) to x(n−1) are used, according to whether the temperature in the transmitting apparatus 100 is high or low, the power calculation results for calculating an address in the Y-axis direction. For example, the moving average period changing unit 1008 changes a time period in which the power calculation results x(0) to x(n−1) are used, by using the moving average period change table which is described with reference to FIG. 11, the power calculation results for calculating an address in the Y-axis direction.

(Example of Moving Average Period Change Table)

Figure 11:
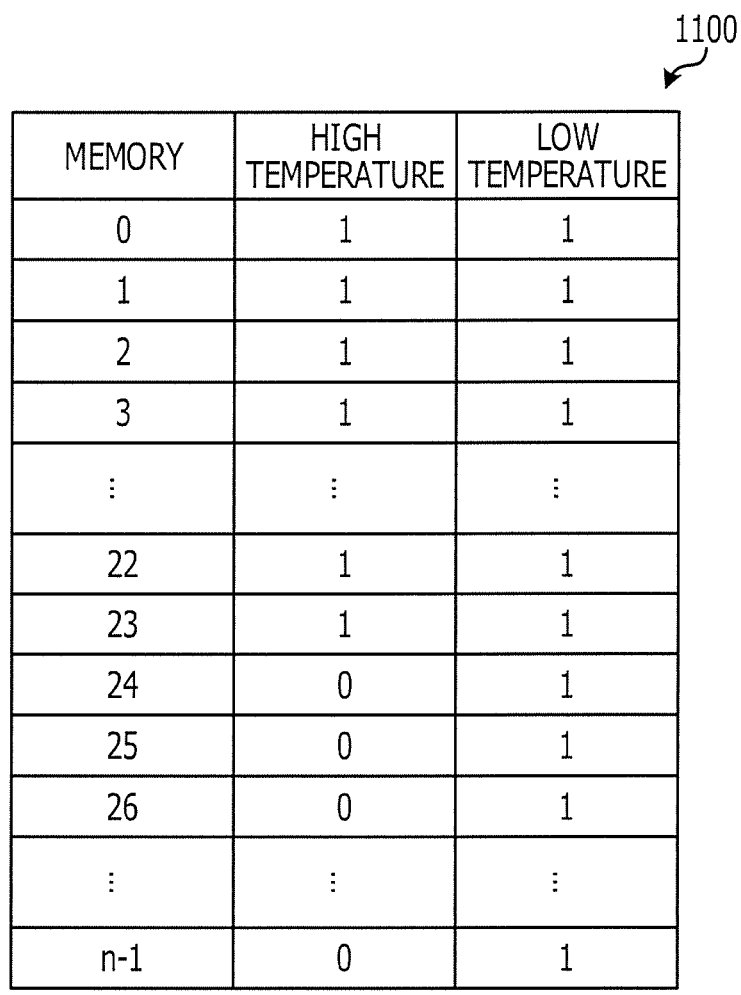
FIG. 11 is an explanatory table illustrating an example of a moving average period change table.

FIG. 11 is an explanatory table illustrating an example of a moving average period change table. As illustrated in FIG. 11, the moving average period change table 1100 stores applicability or inapplicability at a high temperature as well as at a low temperature for each of the memories 1004(0) to 1004(n−1). In the moving average period change table 1100, "1" indicates that a corresponding memory is used for calculation of an address in the Y-axis direction. Also, "0" indicates that a corresponding memory is not used for calculation of an address in the Y-axis direction.

For example, at a high temperature, the power calculation results x(0) to x(23) of the memories 1004(0) to 1004(23) are used, but the power calculation results in the memory 1004(24) and subsequent memories are not used. At a low temperature, the power calculation results x(0) to x(n−1) of all the memories 1004(0) to 1004(n−1) are used.

In this manner, a power calculation result x in a different time period may be used according to a low temperature or a high temperature, that is, a moving average measurement period may be provided so as correspond to a time period in which Idsq drift occurs at a high temperature or at a low temperature. Specifically, at a high temperature, a moving average measurement period having a shorter length than at a low temperature may be provided.

(Example of Gain Correction Curve when Gain is Corrected by Transmitting Apparatus According to Present Embodiment)

Figure 12:
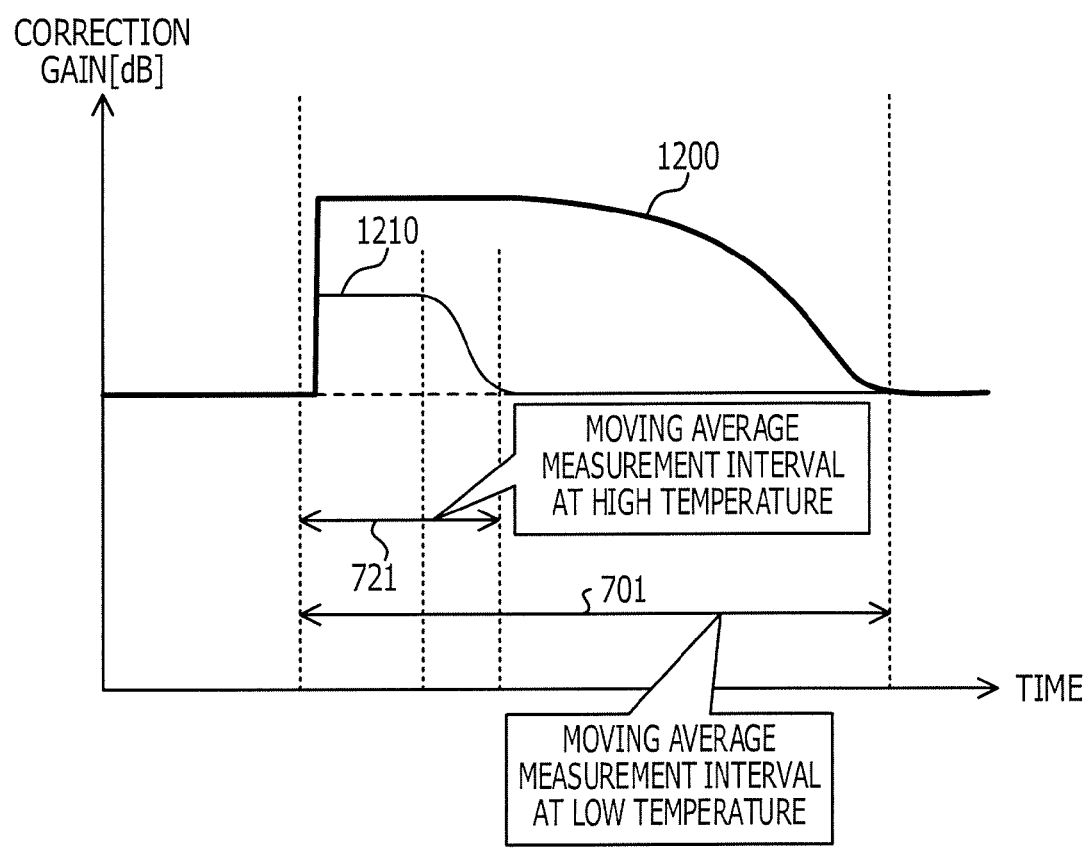
FIG. 12 is an explanatory graph illustrating an example of a gain correction curve when the gain is corrected by a transmitting apparatus according to the present embodiment.

FIG. 12 is an explanatory graph illustrating an example of a gain correction curve when the gain is corrected by a transmitting apparatus according to the present embodiment. In FIG. 12, the horizontal axis indicates time and the vertical axis indicates the correction gain [dB] for the amplifier 106. A graph 1200 illustrates a correction gain for correcting the gain at a low temperature, the gain being decreased (see the graph 600 of FIG. 6) due to an occurrence of Idsq drift. The graph 1200 illustrates a correction gain in the moving average measurement period at low temperature 701. The graph 1200 has a similar curve to the graph 710 which is an ideal curve at a low temperature illustrated in FIG. 7.

A graph 1210 illustrates a correction gain for correcting the gain at a high temperature, the gain being decreased (see the graph 610 of FIG. 6) due to an occurrence of Idsq drift. The graph 1210 illustrates a correction gain in the moving average measurement period at high temperature 721. The graph 1210 has a similar curve to the graph 810 which is an ideal curve at a high temperature illustrated in FIG. 8.

As illustrated in FIG. 12, in the present embodiment, the correction gain (graph 1200) in the moving average measurement period at low temperature 701 may be used at a low temperature. In addition, the correction gain (graph 1210) in the moving average measurement period at high temperature 721 may be used at a high temperature.

In this manner, in the present embodiment, each combined address as a read address of the LUT 204a reflects a tendency of a shorter moving average measurement period at a high temperature than at a low temperature. Therefore, a correction gain according to a decrease in gain due to Idsq drift may be obtained, the Idsq drift being varied according to a high temperature or a low temperature, and thus distortion of signal may be compensated with high accuracy according to a temperature change.

As described above, in the present embodiment, when distortion compensation is performed using an address in the X-axis direction based on the current input signal and an address in the Y-axis direction based on the moving average value of the past input signals, the moving average measurement period is adjusted according to the temperature of the amplifier 106. Consequently, distortion may be compensated with high accuracy according to variation in time period in which Idsq drift occurs.

(First Modification of Address Generation Unit)

Figure 13A:
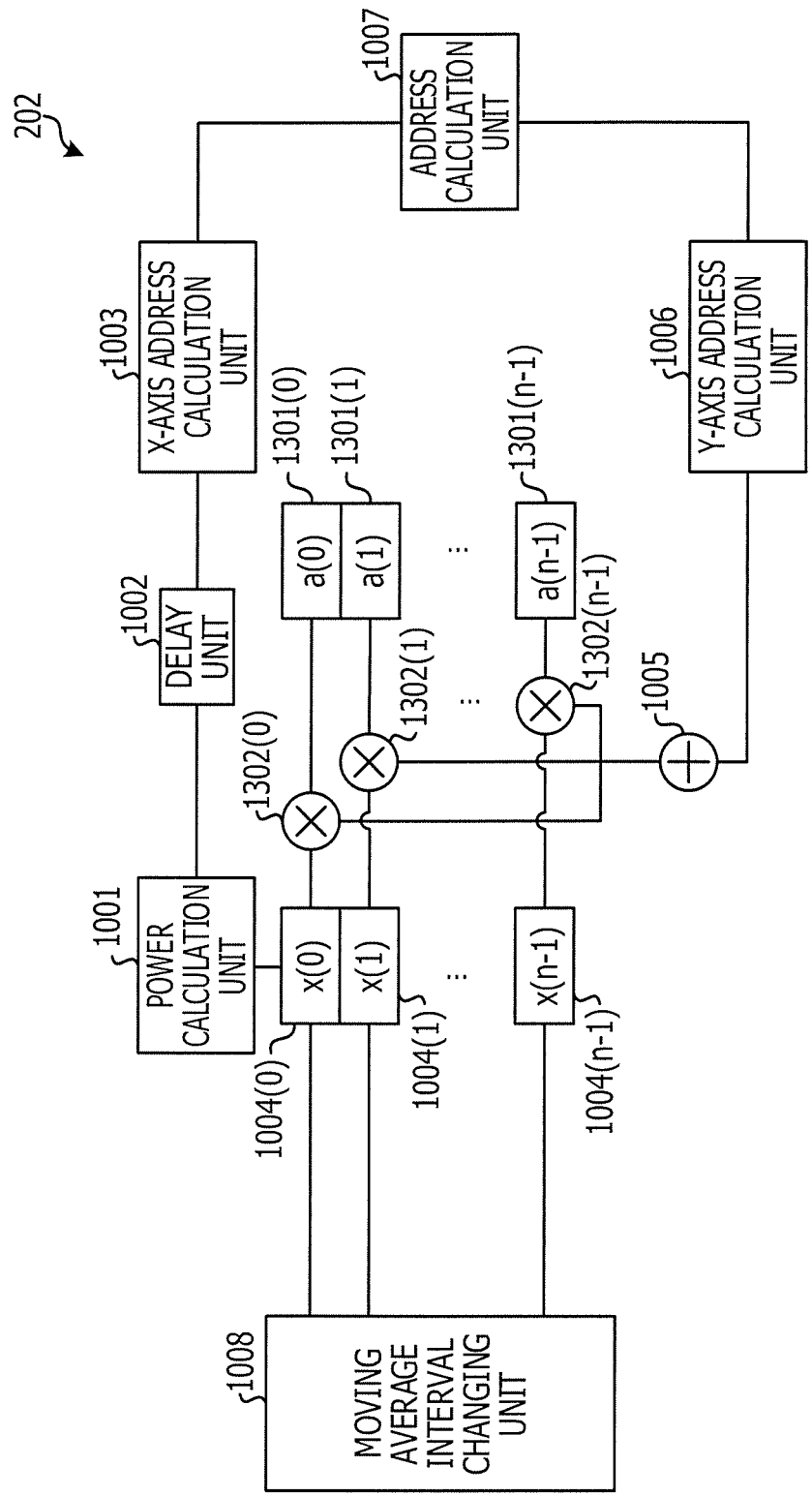
FIG. 13A is an explanatory diagram illustrating a first modification of the address generation unit.
Figure 13B:
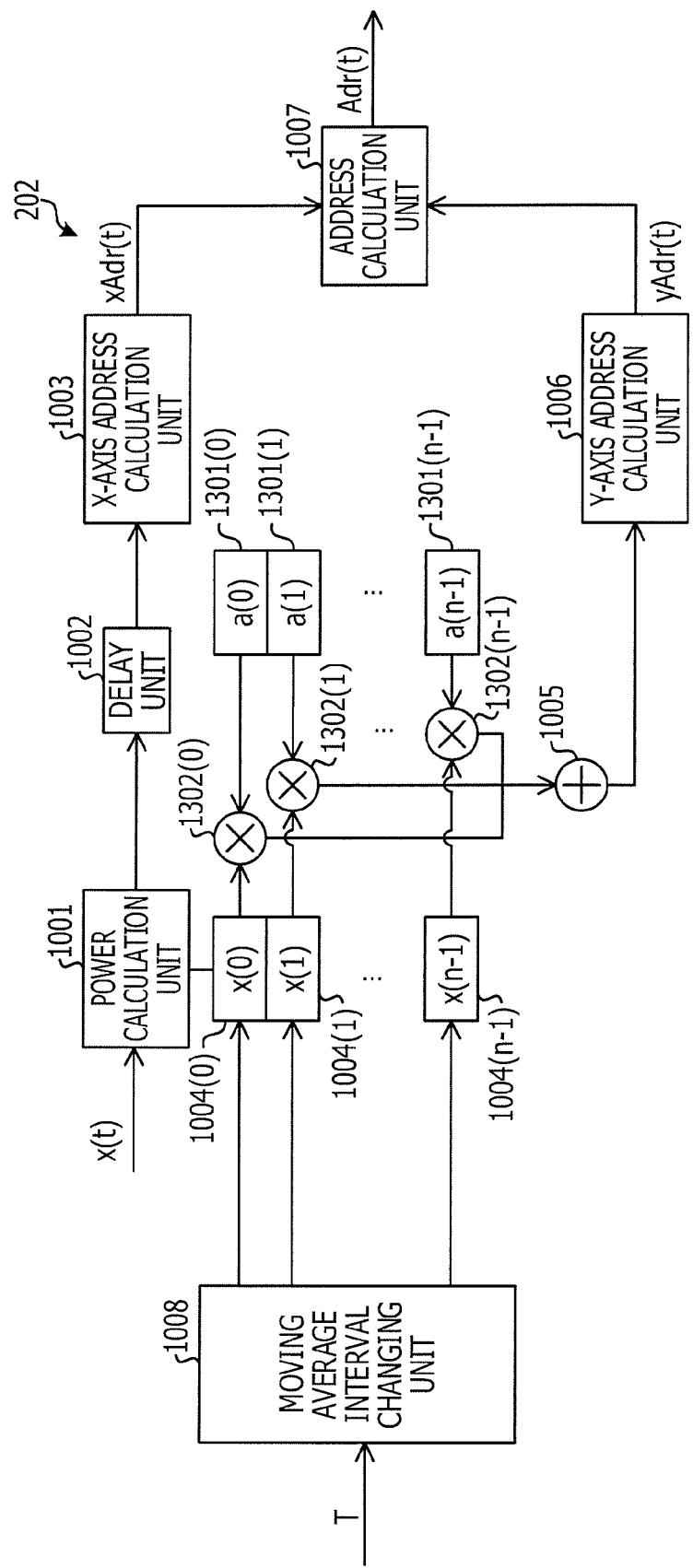
FIG. 13B is a diagram illustrating an example of a signal flow in the address generation unit illustrated in FIG. 13A.

FIG. 13A is an explanatory diagram illustrating a first modification of the address generation unit. FIG. 13B is a diagram illustrating an example of a signal flow in the address generation unit illustrated in FIG. 13A. In FIGS. 13A and 13B, the components substantially the same as the components illustrated in FIGS. 10A and 10B are denoted by the same symbols and description thereof is omitted. The first modification has a configuration in which the second address generation unit 202b (see FIG. 2) generates a second address based on a moving average measurement period having a length according to temperature information, and on a weighted moving average value which is calculated using a weighting coefficient independent of the temperature information.

In FIGS. 13A and 13B, the address generation unit 202 has memories 1301(0) to 1301(n−1), and multiplication units 1302(0) to 1302(n−1).

The memories 1301(0) to 1301(n−1) store weighting coefficients a(0) to a(n−1), respectively. The weighting coefficients a(0) to a(n−1) are stored such that a further past signal has a smaller weight. The weighting coefficients a(0) to a(n−1) stored in the respective memories 1301(0) to 1301(n−1) are outputted to the multiplication units 1302(0) to 1302(n−1), respectively. The power calculation results x(0) to x(n−1) stored in the respective memories 1004(0) to 1004(n−1) are outputted to the multiplication units 1302(0) to 1302(n−1), respectively.

The multiplication units 1302(0) to 1302(n−1) multiply the respective power calculation results x(0) to x(n−1) by the weighting coefficients a(0) to a(n−1), respectively and output multiplication results to the addition unit 1005. The addition unit 1005 adds up the multiplication results obtained by the multiplication units 1302(0) to 1302(n−1), and outputs the sum to the Y-axis address calculation unit 1006.

The moving average period changing unit 1008 changes a time period in which the power calculation results x(0) to x(n−1) are used, according to a high temperature or a low temperature based on the temperature indicated by an input signal T, the power calculation results for calculating an address in the Y-axis direction. Specifically, the moving average period changing unit 1008 changes a time period in which the power calculation results x(0) to x(n−1) are used, according to whether the temperature of the amplifier 106 is high or low, the power calculation results for calculating an address in the Y-axis direction. For example, the moving average period changing unit 1008 changes a time period in which the power calculation results x(0) to x(n−1) are used, by using a table which is similar to the moving average period change table 1100 (see FIG. 11) and indicates applicability or inapplicability of each memory according to a high temperature or a low temperature, the power calculation results for calculating an address in the Y-axis direction.

With this configuration, each combined address as a read address of the LUT 204a reflects a tendency of higher weight on a past signal which is nearer to the current signal. In addition, the combined address reflects a tendency of a shorter moving average measurement period at a high temperature than at a low temperature. Consequently, a correction gain according to a low temperature or a high temperature may be obtained. Therefore, a correction gain according to a decrease in gain due to Idsq drift may be obtained, the Idsq drift being varied according to a high temperature or a low temperature, and thus distortion of signal may be compensated with high accuracy according to a temperature change.

(Second Modification of Address Generation Unit)

Figure 14A:
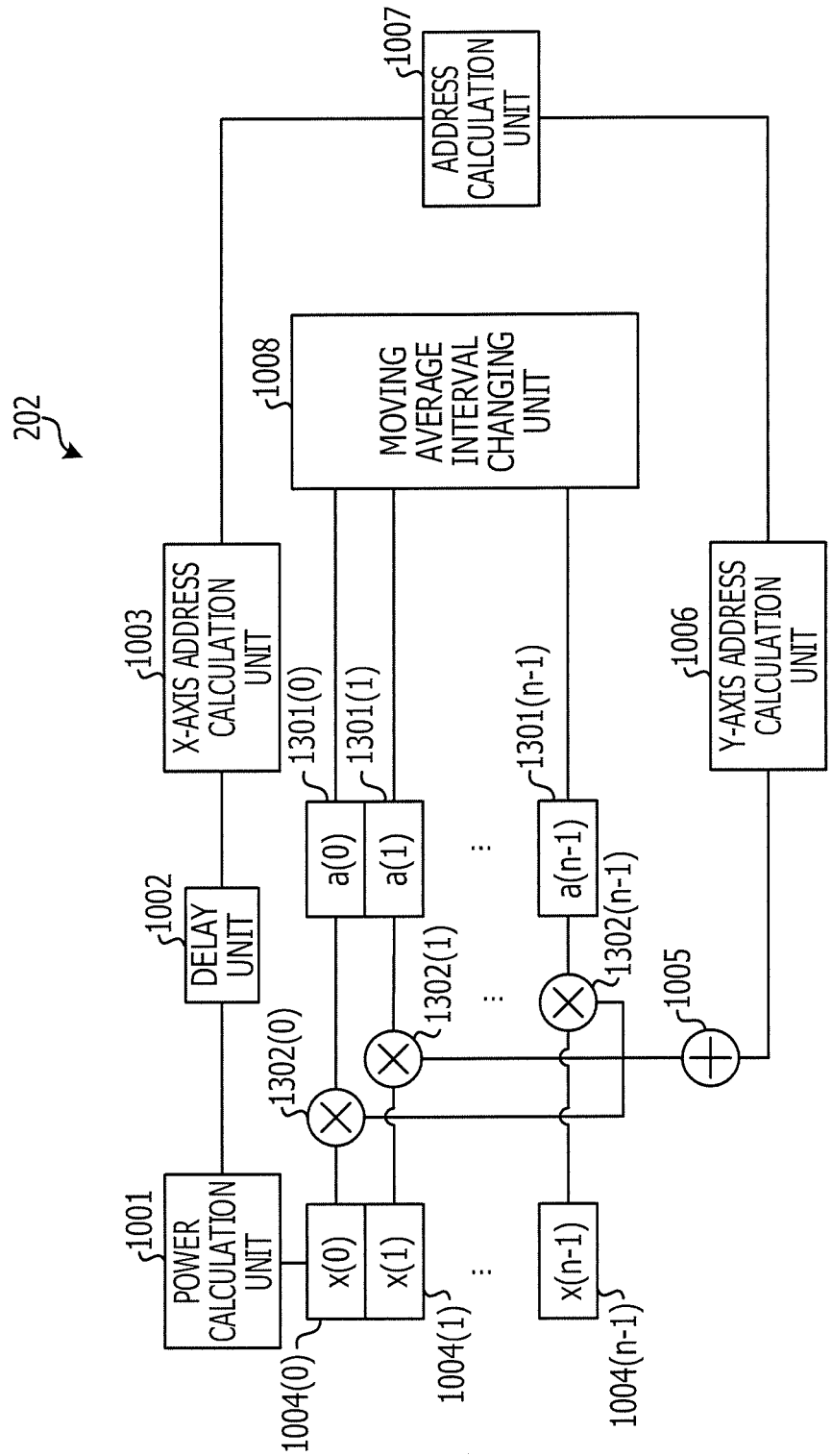
FIG. 14A is an explanatory diagram illustrating a second modification of the address generation unit.
Figure 14B:
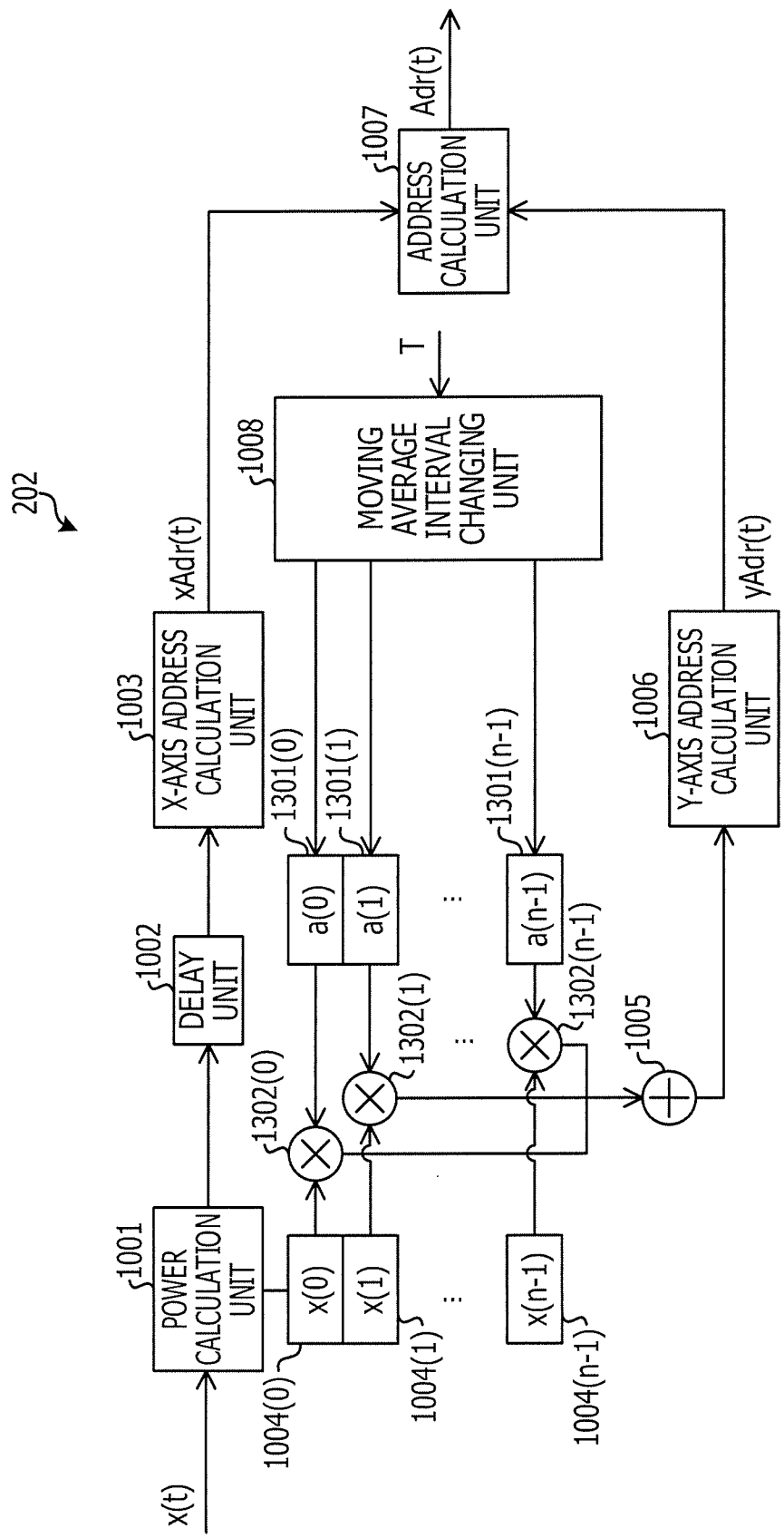
FIG. 14B is a diagram illustrating an example of a signal flow in the address generation unit illustrated in FIG. 14A.

FIG. 14A is an explanatory diagram illustrating a second modification of the address generation unit. FIG. 14B is a diagram illustrating an example of a signal flow in the address generation unit illustrated in FIG. 14A. In FIGS. 14A and 14B, the components substantially the same as the components illustrated in FIGS. 10A and 10B and FIGS. 13A and 13B are denoted by the same symbols and description thereof is omitted.

The second modification has a configuration in which the second address generation unit 202b (see FIG. 2) calculates a weighted moving average value using a weighting coefficient according to temperature information and generates a second address based on the weighted moving average value. Hereinafter, the second address generation unit 202b according to the second modification will be described in detail. The second address generation unit 202b generates a second address based on a weighted moving average value which is calculated using a weighting coefficient with a decrease rate such that a further past signal has a smaller weight. A higher decrease rate indicates that a further past signal has an even smaller weight.

For example, in the case where the temperature information indicates a first temperature, the second address generation unit 202b uses a weighting coefficient with a decrease rate which is higher compared with the case where the temperature information indicates a second temperature which is lower than the first temperature. The second address generation unit 202b is not limited to have a configuration which uses a weighting coefficient according to the first temperature or the second temperature and may use a weighting coefficient having a decrease rate which is higher as the temperature information indicates a higher temperature. In the second modification, the second address generation unit 202b calculates a weighted moving average value using a weighting coefficient without using a moving average measurement period, and generates a second address, the weighting coefficient being defined such that any signal a predetermined time or longer in the past is assigned a value of 0 or nearly 0.

In FIGS. 14A and 14B, the moving average period changing unit 1008 changes the weighting coefficients a(0) to a(n−1) stored in the memories 1301(0) to 1301(n−1) according to whether the temperature indicated by the input signal T is high or low.

The moving average period changing unit 1008 multiplies by a coefficient according to a high temperature or a low temperature using the weighting coefficient table described with reference to FIG. 15. The weighting coefficients a(0) to a(n−1) according to a high temperature or a low temperature are inputted to the multiplication units 1302(0) to 1302(n−1).

(Example of Weighting Coefficient Table)

Figure 15:
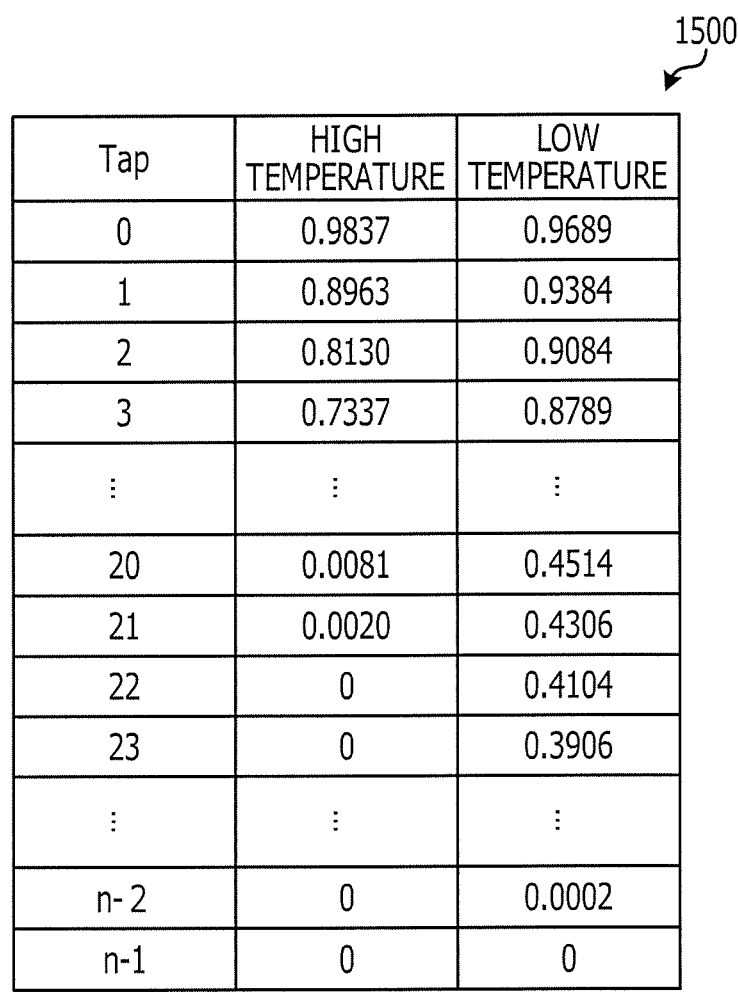
FIG. 15 is an explanatory table illustrating an example of a weighting coefficient table.

FIG. 15 is an explanatory table illustrating an example of a weighting coefficient table. As illustrated in FIG. 15, a weighting coefficient table 1500 stores a weighting coefficient for each of Tap (0 to n−1) at a high temperature and a low temperature. As illustrated in the weighting coefficient table 1500, for both a high temperature and a low temperature, a weighting coefficient is higher for a smaller Tap number (nearer to the current).

Also, at a high temperature, a weighting coefficient is set to "0" more often for a larger Tap number than at a low temperature, and at a high temperature, signals further in the past out of the power calculation results x(0) to x(n−1) have a tendency of a smaller weight than at a low temperature, the power calculation results being used for calculation of an address in the Y-axis direction. That is, the decrease rate at a high temperature is higher than the decrease rate at a low temperature.

With this configuration, each combined address as a read address of the LUT 204a reflects a tendency of higher weight on a past signal which is nearer to the current signal. Also, the combined address reflects a tendency of higher decrease rate at a high temperature than at a low temperature. Consequently, a correction gain according to a low temperature or a high temperature may be obtained. Therefore, a correction gain according to a decrease in gain due to Idsq drift may be obtained, the Idsq drift being varied according to a high temperature or a low temperature, and thus distortion of signal may be compensated with high accuracy according to a temperature change.

(Third Modification of Address Generation Unit)

Figure 16A:
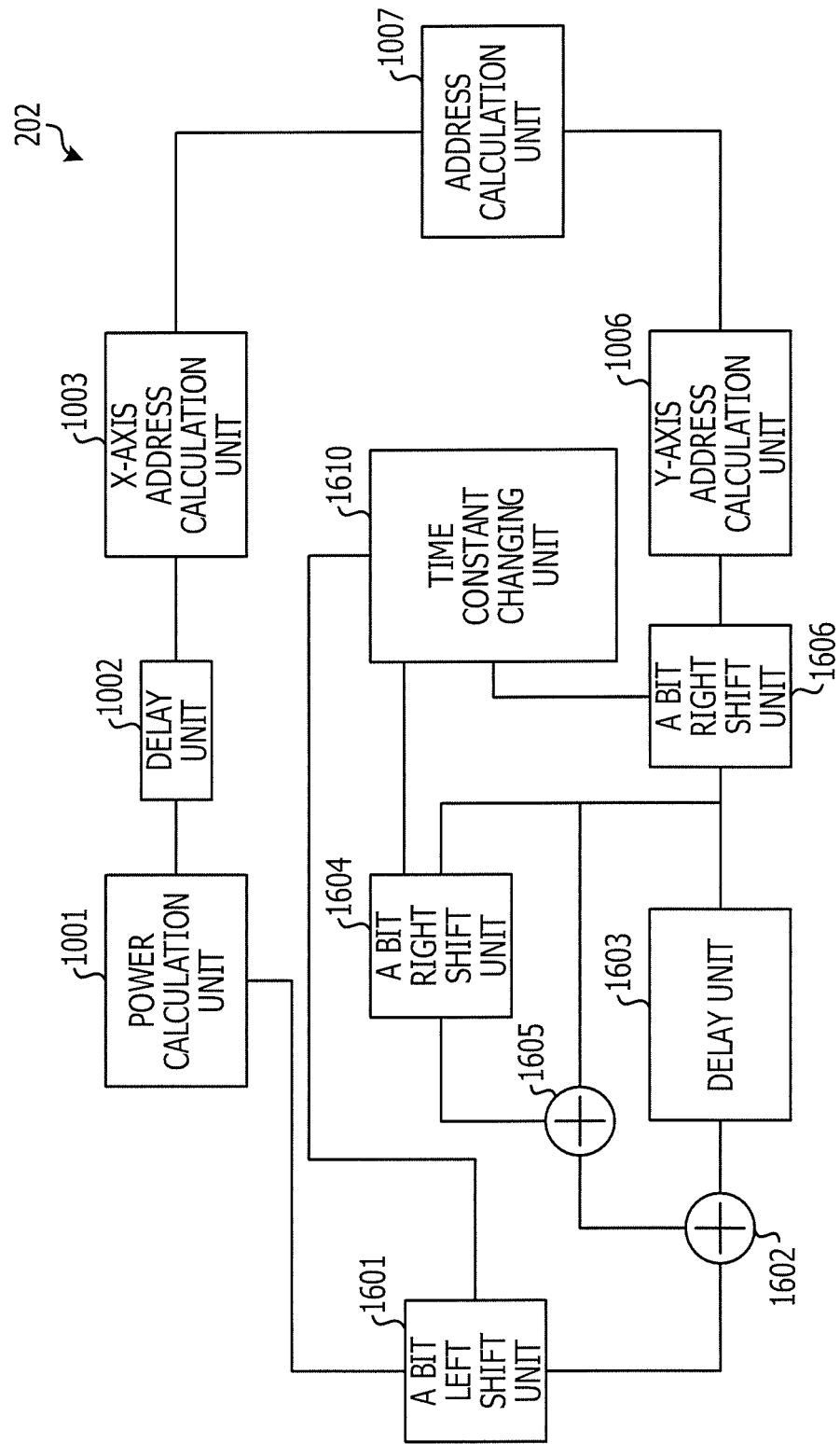
FIG. 16A is an explanatory diagram illustrating a third modification of the address generation unit.
Figure 16B:
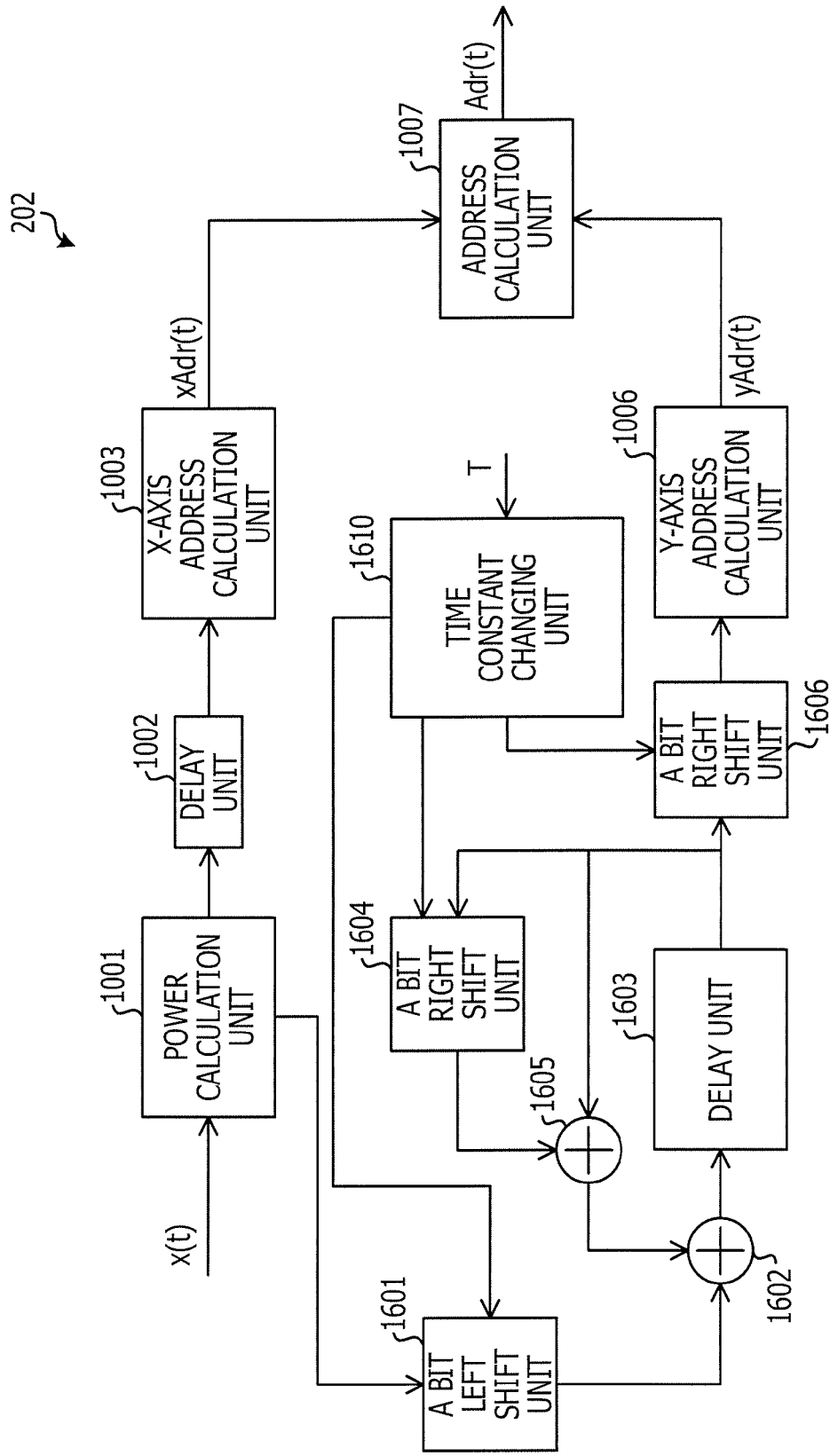
FIG. 16B is a diagram illustrating an example of a signal flow in the address generation unit illustrated in FIG. 16A.

FIG. 16A is an explanatory diagram illustrating a third modification of the address generation unit. FIG. 16B is a diagram illustrating an example of a signal flow in the address generation unit illustrated in FIG. 16A. In FIGS. 16A and 16B, the components substantially the same as the components illustrated in FIGS. 10A and 10B are denoted by the same symbols and description thereof is omitted.

The third modification and the below-described fourth modification each have a configuration in which the second address generation unit 202b (see FIG. 2) calculates an exponential moving average value using a smoothing coefficient according to temperature information and generates a second address based on the exponential moving average value. Here, the second address generation unit 202b according to the third modification will be described in detail. The second address generation unit 202b generates a second address based on an exponential moving average value which is calculated using a smoothing coefficient (time constant) with a decrease rate such that a further past signal has a smaller weight. A higher decrease rate indicates that a further past signal has an even smaller weight.

In the case where the temperature information indicates a first temperature, the second address generation unit 202b uses a smoothing coefficient with a decrease rate which is higher compared with the case where the temperature information indicates a second temperature which is lower than the first temperature. The second address generation unit 202b is not limited to have a configuration which uses a smoothing coefficient according to the first temperature or the second temperature and may use a smoothing coefficient having a decrease rate which is higher as the temperature information indicates a higher temperature.

The address generation unit 202 illustrated in FIGS. 16A and 16B generates an address in the X-axis direction based on the power value of the input signal x(t), determines the exponential moving average value of the power value of the current transmission signal, and generates an address in the Y-axis direction based on the determined exponential moving average value.

As illustrated in FIGS. 16A and 16B, the address generation unit 202 has an A bit left shift unit 1601, an addition unit 1602, a delay unit 1603, an A bit right shift unit 1604, an addition unit 1605, an A bit right shift unit 1606, and a time constant changing unit 1610.

The power calculation unit 1001 outputs power information (transmission power value) to the delay unit 1002 and the A bit left shift unit 1601, the power information indicating the calculated current power p. The delay unit 1002 receives an input of a transmission power value outputted from the power calculation unit 1001, delays the transmission power value, and outputs the delayed transmission power value to the X-axis address calculation unit 1003. The time by which the transmission power value is delayed by the delay unit 1002 corresponds to the processing time taken by the A bit left shift unit 1601, the addition unit 1602, the delay unit 1603, the A bit right shift unit 1606, and the Y-axis address calculation unit 1006.

The A bit left shift unit 1601 receives a transmission power value from the power calculation unit 1001. The A bit left shift unit 1601 shifts the transmission power value by A (A is any natural number) bits to the left. Shifting to the left by A bit(s) refers to an operation that a target value is shifted by A bit(s) in the direction from the least significant bit of the value to the most significant bit thereof. Shifting a target value to the left by A bit(s) is equivalent to multiplying the target value by $2^A$.

That is, the A bit left shift unit 1601 shifts the transmission power value to the left by A bit(s), thereby multiplying the transmission power value by $2^A$. Multiplying the transmission power value by $2^A$ by the A bit left shift unit 1601 causes the number of digits in the integer part of the transmission power value to increase, thereby making it possible to improve the precision of a calculation result obtained by calculation using the transmission power value.

The time constant changing unit 1610 outputs a signal to the A bit left shift unit 1601, the A bit right shift unit 1604, and the A bit right shift unit 1606 based on the temperature of the amplifier 106 indicated by the input signal T, the signal for changing the time constant according to a high temperature or a low temperature. For example, the time constant changing unit 1610 outputs a signal to the A bit left shift unit 1601, the A bit right shift unit 1604, and the A bit right shift unit 1606, the signal for changing the time constant so as to have a higher decrease rate at a high temperature than at a low temperature.

The A bit left shift unit 1601, when receiving a signal from the time constant changing unit 1610, shifts the transmission power value to the left by a predetermined number of bits according to the received signal, the signal for changing the time constant according to a high temperature or a low temperature. The A bit left shift unit 1601 outputs the transmission power value, which is shifted to the left, to the addition unit 1602. The transmission power value which is shifted to the left is referred to as a "left-shifted power value" in the following. The left-shifted power value is the power value of the current signal.

The addition unit 1602 receives an input of a left-shifted power value from the A bit left shift unit 1601. In addition, the addition unit 1602 receives an input of the below-described addend from the addition unit 1605. Each time an addend is newly inputted from the addition unit 1605, the addition unit 1602 adds the left-shifted power value to the addend. The value of the sum of the left-shifted power value and the addend is referred to as a "power addition value" in the following. The addition unit 1602 outputs the calculated power addition value to the delay unit 1603.

The delay unit 1603 receives the power addition value outputted from the addition unit 1602. The delay unit 1603 delays the power addition value by one sample. For example, let psum(t) be the power addition value at time t, then the power addition value delayed by one sample by the delay unit 1603 is expressed by psum(t−1). The power addition value delayed by one sample by the delay unit 1603 is referred to as a "delayed power addition value" in the following.

The delayed power addition value is an exponential moving average value obtained by applying exponential moving average to the current transmission power value and the past transmission power values. The delay unit 1603 outputs the calculated delayed power addition value to the A bit right shift unit 1604, the addition unit 1605, and the A bit right shift unit 1606.

The A bit right shift unit 1604 receives the delayed power addition value from the delay unit 1603. The A bit right shift unit 1604 shifts the delayed power addition value to the right by A bit(s). Shifting to the right by A bit(s) refers to an operation that a target value is shifted by A bit(s) in the direction from the most significant bit of the value to the least significant bit thereof.

Shifting a target value to the right by A bit(s) is equivalent to multiplying the target value by $1/2^A$. That is, the A bit right shift unit 1604 shifts the delayed power addition value to the right by A bit(s), thereby multiplying the delayed power addition value by $1/2^A$.

The A bit right shift unit 1604, when receiving a signal from the time constant changing unit 1610, shifts the transmission power value to the right by a predetermined number of bits according to the received signal, the signal for changing the time constant according to a high temperature or a low temperature. The A bit right shift unit 1604 outputs the delayed power addition value, which is shifted to the right, to the addition unit 1605. The delayed power addition value which is shifted to the right is referred to as a "right-shifted addition value" in the following.

The addition unit 1605 receives an input of a right-shifted addition value from the A bit right shift unit 1604. In addition, the addition unit 1605 receives an input of a delayed power addition value from the delay unit 1603. The addition unit 1605 inverts the sign of the right-shifted addition value, and adds up the sign-inverted right-shifted addition value and the delayed power addition value, thereby calculating a new addend which has a smaller value than the delayed power addition value. In other words, the addition unit 1605 calculates a new addend by subtracting the right-shifted addition value from the delayed power addition value. The addition unit 1605 outputs the newly calculated addend to the addition unit 1602.

The A bit right shift unit 1606 receives a delayed power addition value from the delay unit 1603. The A bit right shift unit 1606 shifts the delayed power addition value to the right by A bit(s). Shifting a target value to the right by A bit(s) is equivalent to multiplying the target value by $1/2^A$. That is, the A bit right shift unit 1606 shifts the delayed power addition value to the right by A bit(s), thereby multiplying the delayed power addition value by $1/2^A$. Multiplying the delayed power addition value by $1/2^A$ by the A bit right shift unit 1606 returns the number of digits in the integer part of the delayed power addition value to the number of digits in the integer part of the transmission power value.

The A bit right shift unit 1606 receives from the time constant changing unit 1610 a signal for changing the time constant according to a high temperature or a low temperature. The A bit right shift unit 1606, when receiving a signal for changing the time constant, shifts the transmission power value to the right by a predetermined number of bits according to the received signal. The A bit right shift unit 1606 outputs the right-shifted addition value to the Y-axis address calculation unit 1006.

The Y-axis address calculation unit 1006 receives the right-shifted addition value from the A bit right shift unit 1606. The Y-axis address calculation unit 1006 normalizes the received right-shifted addition value, thereby generating an address in the Y-axis direction which is an address in the second dimensional direction according to the right-shifted addition value. The Y-axis address calculation unit 1006 outputs the generated address in the Y-axis direction to the address calculation unit 1007.

The combined address generated by the address calculation unit 1007 includes an address in the X-axis direction which is generated from the power value of the current transmission signal and an address in the Y-axis direction which is generated from the exponential moving average value of the power value of the current transmission signal and the power values of the past transmission signals. In other words, the combined address reflects a tendency of exponentially increasing weight on the past signal nearer to the current signal, the combined address serving as a read address AR of the LUT 204a of the table management unit 204 at a low temperature or at a high temperature.

In this manner, according to the third modification, shifting by the number of bits according to a low temperature or a high temperature allows the time constant to be changed according to a high temperature or a low temperature, and thus an exponential moving average value may be changed.

With this configuration, each combined address as a read address of the LUT 204a reflects a tendency of exponentially higher weight on a past signal which is nearer to the current signal. Also, the combined address reflects a tendency of higher decrease rate at a high temperature than at a low temperature. Consequently, a correction gain according to a low temperature or a high temperature may be obtained. Therefore, a correction gain according to a decrease in gain due to Idsq drift may be obtained, the Idsq drift being varied according to a high temperature or a low temperature, and thus distortion of signal may be compensated with high accuracy according to a temperature change.

(Fourth Modification of Address Generation Unit)

Figure 17A:
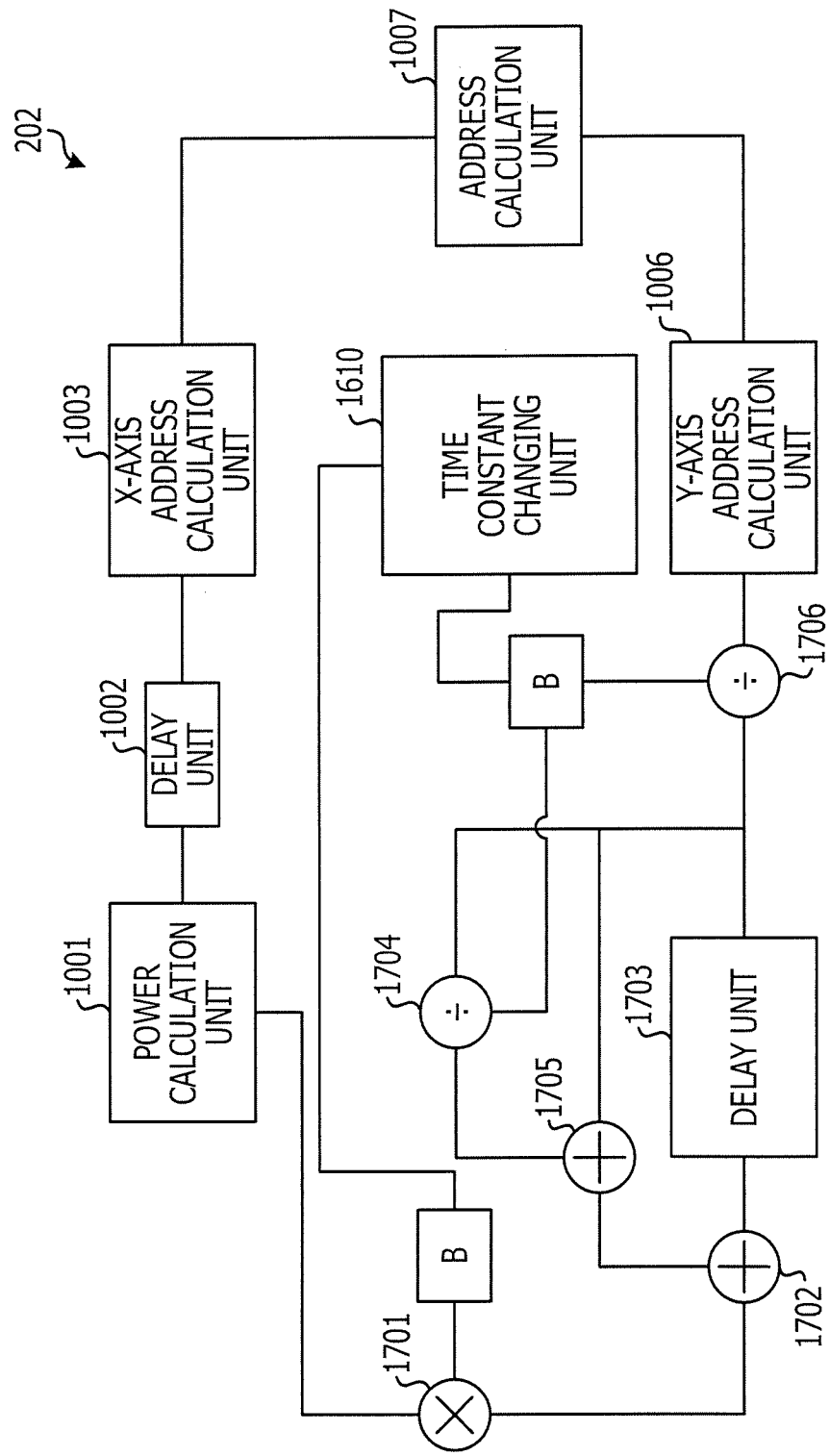
FIG. 17A is an explanatory diagram illustrating a fourth modification of the address generation unit.
Figure 17B:
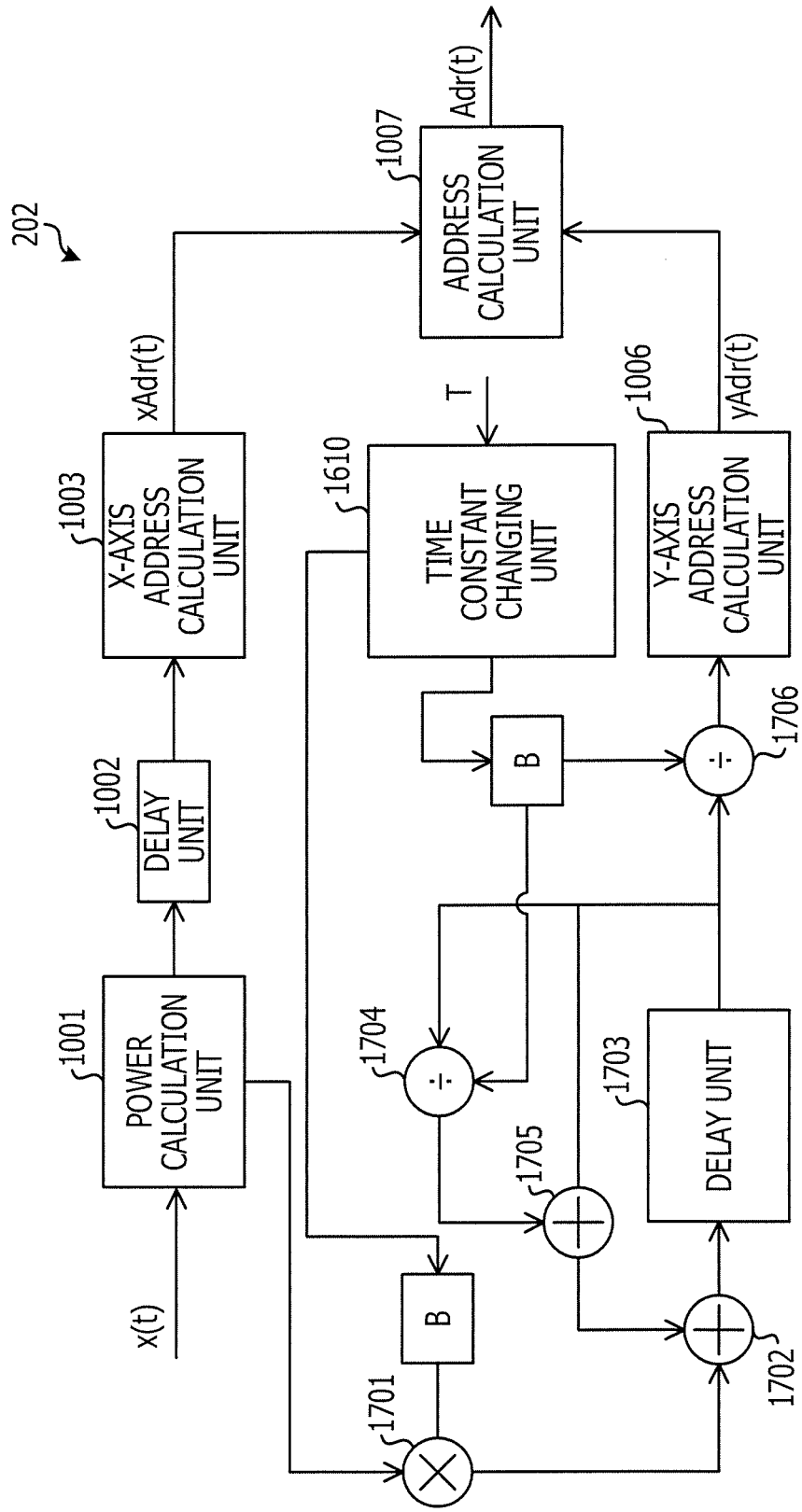
FIG. 17B is a diagram illustrating an example of a signal flow in the address generation unit illustrated in FIG. 17A.

FIG. 17A is an explanatory diagram illustrating a fourth modification of the address generation unit. FIG. 17B is a diagram illustrating an example of a signal flow in the address generation unit illustrated in FIG. 17A. The address generation unit 202 according to the fourth modification differs from that according to the third modification in calculation method for an addend based on the power value of the current transmission signal. In FIGS. 17A and 17B, the components substantially the same as the components illustrated in FIGS. 16A and 16B are denoted by the same symbols and description thereof is omitted.

The address generation unit 202 has a multiplication unit 1701, an addition unit 1702, a delay unit 1703, a division unit 1704, an addition unit 1705, and a division unit 1706. The power calculation unit 1001 outputs the calculated current transmission power value to the delay unit 1002 and the multiplication unit 1701. The multiplication unit 1701 receives the transmission power value from the power calculation unit 1001. The multiplication unit 1701 multiplies the transmission power value by a real number B, thereby generating B times the transmission power value.

Multiplying the transmission power value by B by the multiplication unit 1701 causes the number of digits in the integer part of the transmission power value to increase, thereby making it possible to improve the precision of a calculation result obtained by calculation using the transmission power value. The real number B is set to a different value by the time constant changing unit 1610 according to a high temperature or a low temperature.

The time constant changing unit 1610 outputs a signal to the multiplication unit 1701, the division unit 1704, and the division unit 1706 based on the temperature of the amplifier 106 indicated by the input signal T, the signal for changing the time constant according to a high temperature or a low temperature. For example, the time constant changing unit 1610 outputs a signal to the multiplication unit 1701, the division unit 1704, and the division unit 1706, the signal for changing the time constant so as to have a higher decrease rate at a high temperature than at a low temperature.

The multiplication unit 1701, when receiving a signal from the time constant changing unit 1610, multiplies the transmission power value by a factor according to the received signal, the signal for changing the time constant according to a high temperature or a low temperature. The multiplication unit 1701 outputs the multiplied transmission power value to the addition unit 1702. The transmission power value multiplied by the multiplication unit 1701 is referred to as a "multiplication power value" in the following. The multiplication power value is the power value of the current signal.

The addition unit 1702 receives the multiplication power value from the multiplication unit 1701. The addition unit 1702 receives an input of the below-described addend from the addition unit 1705. Each time an addend is newly inputted from the addition unit 1705, the addition unit 1702 adds the multiplication power value to the addend. The value of the sum of the multiplication power value and the addend is referred to as a "power addition value" in the following. The addition unit 1702 outputs the calculated power addition value to the delay unit 1703.

The delay unit 1703 receives the power addition value from the addition unit 1702. The delay unit 1703 delays the power addition value by one sample. The power addition value delayed by one sample by the delay unit 1703 is referred to as a "delayed power addition value" in the following. The delayed power addition value is an exponential moving average value obtained by applying exponential moving average to the current transmission power value and the past transmission power values. The delay unit 1703 outputs the calculated delayed power addition value to the division unit 1704, the addition unit 1705, and the division unit 1706.

The division unit 1704 receives the delayed power addition value from the delay unit 1703. The division unit 1704 divides the delayed power addition value by a predetermined real number B. The division unit 1704, when receiving a signal from the time constant changing unit 1610, divides the delayed power addition value by a factor according to the received signal, the signal for changing the time constant according to a high temperature or a low temperature. The value obtained by dividing the delayed power addition value is referred to as a "division power value" in the following. The division unit 1704 outputs the calculated division power value to the addition unit 1705.

The addition unit 1705 receives an input of the division power value from the division unit 1704. The addition unit 1705 receives the delayed power addition value from the delay unit 1703. The addition unit 1705 inverts the sign of the division power value, and adds up the sign-inverted division power value and the delayed power addition value, thereby calculating a new addend which has a smaller value than the delayed power addition value. In other words, the addition unit 1705 calculates a new addend by subtracting the division power value from the delayed power addition value. The addition unit 1705 outputs the newly calculated addend to the addition unit 1702.

The division unit 1706 receives a delayed power addition value from the delay unit 1703. The division unit 1706 divides the delayed power addition value by the predetermined real number B. Dividing the delayed power addition value by B by the division unit 1706 returns the number of digits in the integer part of the delayed power addition value to the number of digits in the integer part of the transmission power value. The division unit 1706, when receiving a signal from the time constant changing unit 1610, divides the delayed power addition value by a factor according to the received signal, the signal for changing the time constant according to a high temperature or a low temperature. The division unit 1706 outputs the value obtained by dividing the delayed power addition value, that is, the division power value to the Y-axis address calculation unit 1006.

In this manner, according to the fourth modification, changing the real number B according to a low temperature or a high temperature allows the time constant (smoothing constant) to be changed according to a low temperature or a high temperature, and thus an exponential moving average value may be changed. The configuration of the fourth modification provides the same effect as that in the third modification.

As described above, according to the first to fourth modifications, distortion may be compensated with high accuracy according to variation in time period in which Idsq drift occurs.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A distortion compensation apparatus comprising:
a memory configured to store a plurality of distortion compensation coefficients for compensating distortion to an input signal amplified by an amplifier, each of the plurality of distortion compensation coefficients being associated with a different combination of a first address and a second address; and
a processor configured to:
receive temperature information associated with a temperature of the amplifier,
generate the first address based on the input signal at a first time,
generate the second address based on an average of the input signal during a previous period preceding the first time, the previous period changing in accordance with the temperature information, the average being calculated based on the temperature information,
select a distortion compensation coefficient from the plurality of distortion compensation coefficients based on the first address and the second address, and
compensate distortion to the input signal based on the selected distortion compensation coefficient.

2. The distortion compensation apparatus according to claim 1, wherein
a length of the previous period is determined based on the temperature information.

3. The distortion compensation apparatus according to claim 2, wherein
the length of the previous period is set to a first length when the temperature information indicates a temperature more than a certain temperature, and the length of the previous period is set to a second length that is longer than the first length when the temperature information indicates a temperature less than the certain temperature.

4. The distortion compensation apparatus according to claim 2, wherein
the average is a simple moving average.

5. The distortion compensation apparatus according to claim 1, wherein
the average is a weighted moving average using weights.

6. The distortion compensation apparatus according to claim 5, wherein
each difference of the weights in case when the temperature information indicates a temperature more than a certain temperature is more than each difference of the weights in case when the temperature information indicates a temperature less than the certain temperature.

7. The distortion compensation apparatus according to claim 1, wherein
the average is a exponentially weighted moving average using smoothing coefficients.

8. The distortion compensation apparatus according to claim 7, wherein
each difference of the smoothing coefficients in case when the temperature information indicates a temperature more than a certain temperature is more than each difference of the smoothing coefficients in case when the temperature information indicates a temperature less than the certain temperature.

9. A transmission apparatus comprising:
an amplifier configured to amplify an input signal;
a memory configured to store a plurality of distortion compensation coefficients for compensating distortion to the input signal, each of the plurality of distortion compensation coefficients being associated with a different combination of a first address and a second address; and
a processor configured to
receive temperature information associated with a temperature of the amplifier, generate the first address based on the input signal at a first time,
generate the second address based on an average of the input signal during a previous period preceding the first time, the previous period changing in accordance with the temperature information, the average being calculated based on the temperature information,
select a distortion compensation coefficient from the plurality of distortion compensation coefficients based on the first address and the second address, and
compensate distortion to the input signal based on the selected distortion compensation coefficient.

10. A distortion compensation method comprising:
storing a plurality of distortion compensation coefficients for compensating distortion to an input signal amplified by an amplifier, each of the plurality of distortion compensation coefficients being associated with a different combination of a first address and a second address;
receiving temperature information associated with a temperature of the amplifier;
generating the first address based on the input signal at a first time;
generating the second address based on an average of the input signal during a previous period preceding the first time, the previous period changing in accordance with the temperature information, the average being calculated based on the temperature information;
selecting a distortion compensation coefficient from the plurality of distortion compensation coefficients based on the first address and the second address; and
compensating distortion to the input signal based on the selected distortion compensation coefficient.

* * * * *